(12) United States Patent
Swaris et al.

(10) Patent No.: US 7,387,406 B2
(45) Date of Patent: *Jun. 17, 2008

(54) MODULAR MOUNTING ARRANGEMENT AND METHOD FOR LIGHT EMITTING DIODES

(75) Inventors: Jagath Swaris, Palos Verdes, CA (US); Scott Van Ness, Temecula, CA (US)

(73) Assignee: Permlight Products, Inc., Tustin, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/294,974

(22) Filed: Dec. 6, 2005

(65) Prior Publication Data

US 2006/0087844 A1 Apr. 27, 2006

Related U.S. Application Data

(63) Continuation of application No. 10/909,933, filed on Aug. 2, 2004, now Pat. No. 7,108,396, which is a continuation of application No. 10/417,896, filed on Apr. 16, 2003, now Pat. No. 6,846,093, which is a continuation of application No. 09/948,338, filed on Sep. 5, 2001, now Pat. No. 6,578,986.

(60) Provisional application No. 60/301,951, filed on Jun. 29, 2001.

(51) Int. Cl.
*F21V 21/00* (2006.01)
(52) U.S. Cl. ............... 362/249; 362/231; 362/294; 362/373; 362/640
(58) Field of Classification Search ............ 362/249, 362/231, 250, 294, 373, 640; 257/88, 91, 257/99, 103; 445/23–25; 40/544, 570; 29/25, 29/26, 34, 106, 122
See application file for complete search history.

(56) References Cited

U.S. PATENT DOCUMENTS 2,872,750 A * 2/1959 Holcomb .................. 40/610

(Continued)

FOREIGN PATENT DOCUMENTS

CN 2124214 U 12/1992

(Continued)

OTHER PUBLICATIONS

U.S. Appl. No. 60/301,951, filed Jun. 29, 2001, Honegger.

(Continued)

*Primary Examiner*—Sandra O'Shea
*Assistant Examiner*—Mark Tsidulko
(74) *Attorney, Agent, or Firm*—Knobbe, Martens, Olson & Bear LLP

(57) ABSTRACT

A modular light emitting diode (LED) mounting configuration is provided including a light source module having at least one LED. The module includes a heat conductive body portion adapted to conduct heat generated by the LED away from the LED. As a result, the LED can be operated with a higher current than normally allowed. Thus, LED brightness and performance is increased without decreasing life expectancy. An adhesive connects the LED module to the mount surface. A plurality of such LED modules can be pre-wired together in a substantially continuous fashion and provided in a dispenser, such as a roll or box. Thus, to install a plurality of such LED modules, a worker simply pulls modules from the dispenser as needed, secures the appropriate number of modules in place, and connects the assembled modules to a power source.

18 Claims, 17 Drawing Sheets

U.S. PATENT DOCUMENTS

| | | | |
|---|---|---|---|
| 3,936,686 A | 2/1976 | Moore |
| 4,143,411 A | 3/1979 | Roberts |
| 4,173,035 A | 10/1979 | Hoyt |
| 4,720,773 A | 1/1988 | Ahroni |
| 4,729,076 A | 3/1988 | Masami |
| 4,761,720 A | 8/1988 | Solow |
| 4,855,882 A | 8/1989 | Boss |
| 4,908,743 A | 3/1990 | Miller |
| 5,103,382 A | 4/1992 | Kondo et al. |
| 5,222,799 A | 6/1993 | Sears et al. |
| 5,278,432 A | 1/1994 | Ignatius |
| 5,388,357 A | 2/1995 | Malita |
| 5,499,170 A | 3/1996 | Gagne |
| 5,559,681 A | 9/1996 | Duarte |
| 5,565,262 A | 10/1996 | Azzaro et al. |
| 5,581,876 A | 12/1996 | Prabhu et al. |
| 5,598,985 A | 2/1997 | Winesett |
| 5,607,227 A | 3/1997 | Yasumoto et al. |
| 5,660,461 A | 8/1997 | Ignatius et al. |
| 5,661,953 A | 9/1997 | Jolley |
| 5,695,148 A | 12/1997 | Christensen |
| 5,697,175 A | 12/1997 | Schwartz |
| 5,728,432 A | 3/1998 | Imashiro et al. |
| 5,746,497 A | 5/1998 | Machida |
| 5,857,767 A * | 1/1999 | Hochstein | 362/294 |
| 5,941,388 A | 8/1999 | Spielberger |
| 5,953,469 A | 9/1999 | Zhou |
| 5,957,401 A | 9/1999 | O'Donnell |
| 6,042,248 A | 3/2000 | Hannah et al. |
| 6,045,240 A | 4/2000 | Hochstein |
| 6,056,420 A | 5/2000 | Wilson et al. |
| 6,075,701 A | 6/2000 | Ali et al. |
| 6,244,728 B1 | 6/2001 | Cote et al. |
| 6,249,267 B1 | 6/2001 | Ishihara |
| 6,250,774 B1 | 6/2001 | Begemann et al. |
| 6,283,612 B1 | 9/2001 | Hunter |
| 6,299,337 B1 | 10/2001 | Bachl et al. |
| 6,350,039 B1 | 2/2002 | Lee |
| 6,371,637 B1 | 4/2002 | Atchinson et al. |
| 6,394,626 B1 | 5/2002 | McColloch |
| 6,396,466 B1 | 5/2002 | Pross et al. |
| 6,412,971 B1 | 7/2002 | Wojnarowski et al. |
| 6,428,189 B1 | 8/2002 | Hochstein |
| 6,455,930 B1 | 9/2002 | Palanisamy et al. |
| 6,478,450 B1 * | 11/2002 | Grajcar | 362/249 |
| 6,481,130 B1 * | 11/2002 | Wu | 40/546 |
| 6,481,874 B2 | 11/2002 | Petroski |
| 6,485,160 B1 | 11/2002 | Sommers et al. |
| 6,505,956 B1 | 1/2003 | Priddy et al. |
| 6,517,218 B2 | 2/2003 | Hochstein |
| 6,518,502 B2 | 2/2003 | Hammond et al. |
| 6,528,954 B1 | 3/2003 | Lys et al. |
| 6,548,967 B1 | 4/2003 | Dowling et al. |
| 6,554,446 B1 | 4/2003 | Walsh et al. |
| 6,566,824 B2 | 5/2003 | Panagotacos et al. |
| 6,573,536 B1 | 6/2003 | Dry |
| 6,578,986 B2 | 6/2003 | Swaris et al. |
| 6,582,100 B1 | 6/2003 | Hochstein et al. |
| 6,582,103 B1 | 6/2003 | Popovich et al. |
| 6,641,283 B1 | 11/2003 | Bohler |
| 6,642,666 B1 | 11/2003 | St-Germain |
| 6,648,496 B1 | 11/2003 | Elghoroury et al. |
| 6,659,622 B2 | 12/2003 | Katogi et al. |
| 6,660,935 B2 | 12/2003 | Southard et al. |
| 6,676,279 B1 | 1/2004 | Hubbell et al. |
| 6,700,136 B2 | 3/2004 | Guida |
| 6,712,486 B1 | 3/2004 | Popovich et al. |
| 6,713,862 B2 | 3/2004 | Palanisamy et al. |
| 6,739,047 B2 | 5/2004 | Hammond et al. |
| 6,758,573 B1 | 7/2004 | Thomas et al. |
| 6,787,999 B2 | 9/2004 | Stimac et al. |
| 6,796,698 B2 | 9/2004 | Sommers et al. |
| 6,799,864 B2 | 10/2004 | Bohler et al. |
| 6,846,093 B2 | 1/2005 | Swaris et al. |
| 6,871,983 B2 | 3/2005 | Jacob et al. |
| 7,108,396 B2 * | 9/2006 | Swaris et al. | 362/249 |
| 7,114,831 B2 | 10/2006 | Popovich et al. |
| 2001/0015891 A1 | 8/2001 | Suzuki et al. |
| 2001/0032985 A1 | 10/2001 | Bhat et al. |

FOREIGN PATENT DOCUMENTS

| | | |
|---|---|---|
| CN | 1245521 A | 2/2000 |
| EP | 0331224 | 9/1989 |
| EP | 0632511 | 6/1994 |
| EP | 0921568 A2 | 6/1999 |
| GB | 2243548 | 11/1991 |
| JP | 9223820 | 8/1997 |
| WO | WO 97/37385 | 10/1997 |
| WO | WO00/36336 | 6/2000 |

OTHER PUBLICATIONS

U.S. Appl. No. 60/200,531, filed Apr. 27, 2000, Honegger.

U.S. Appl. No. 60/193,531, filed Mar. 31, 2000, Hochstein.

U.S. Appl. No. 60/160,480, filed Oct. 19, 1999, Popovich.

Hewlett Packard, Angeline Wong, Subminiature InGaN Blue Lamps, pp. 1-2, Aug. 4, 1998.

Hewlett Packard, Subminiature High Performance AlInGaP LED Lamps, Technical Data, pp. 1-161-1-162, no date.

Hewlett Packard, Super Flux LED's pp. 1-25, 1-26, and ii, no date.

HP SunPower Series High-Flux LED Data Sheet, no date.

Petroski, James, "Thermal Challenges Facing New Generation LEDs for Lighting Applications," in Solid State Lighting II, Proceedings of SPIE vol. 4776 (2002).

Report on the Filing or Determination of an Action Regarding a Patent or Trademark. Case No. SACV05-287 CJC (RNBx); *Permlight* v. *Gelcore*, no date.

Report on the Filing or Determination of an Action Regarding a Patent or Trademark. Case No. SACV04-00197 Doc (Ex); *Permlight* v. *U.S. LED, Ltd.*, no date.

Thermagon Catolog, no date.

Thermal Management Considerations for Super Flux LEDs Hewlett Packard, pp. 1-11, no date.

U.S. LED, LTD's First Amended Answer to Complain for Patent Infringement (Demand for Jury Trial) Case, no date.

Purchase Order 002822 of Permlight Products, Inc., dated Jun. 23, 2000.

Invoice 0029879, dated Aug. 1, 2000.

Invoice 83656, dated Aug. 1, 2000.

Invoice 00011382 of Permlight Corporation, dated Aug. 17, 2000 in 2 pages.

Permlight Distributor Price List, Effective Jul. 1, 2000.

LumiLeds Lighting Publication No. DS17, LED Rail System Data Sheet, HLCR-SS99-X1X00, no date.

Chomerics THERMATTACH T404, T405 and T412 Thermally Conductive Adhesive Tapes for Heat Sink Attachment to Ceramic or Metal Components Technical Bulletin, no date.

Defendant and Counterclaimant Gelcore, LLC's Objections and Responses to Plaintiff and Counterdefendant Permlight Products, Inc.'s First set of Interrogatories (Nos. 1-2) Case No. SACV 05-287 AHS (Anx), no date.

* cited by examiner

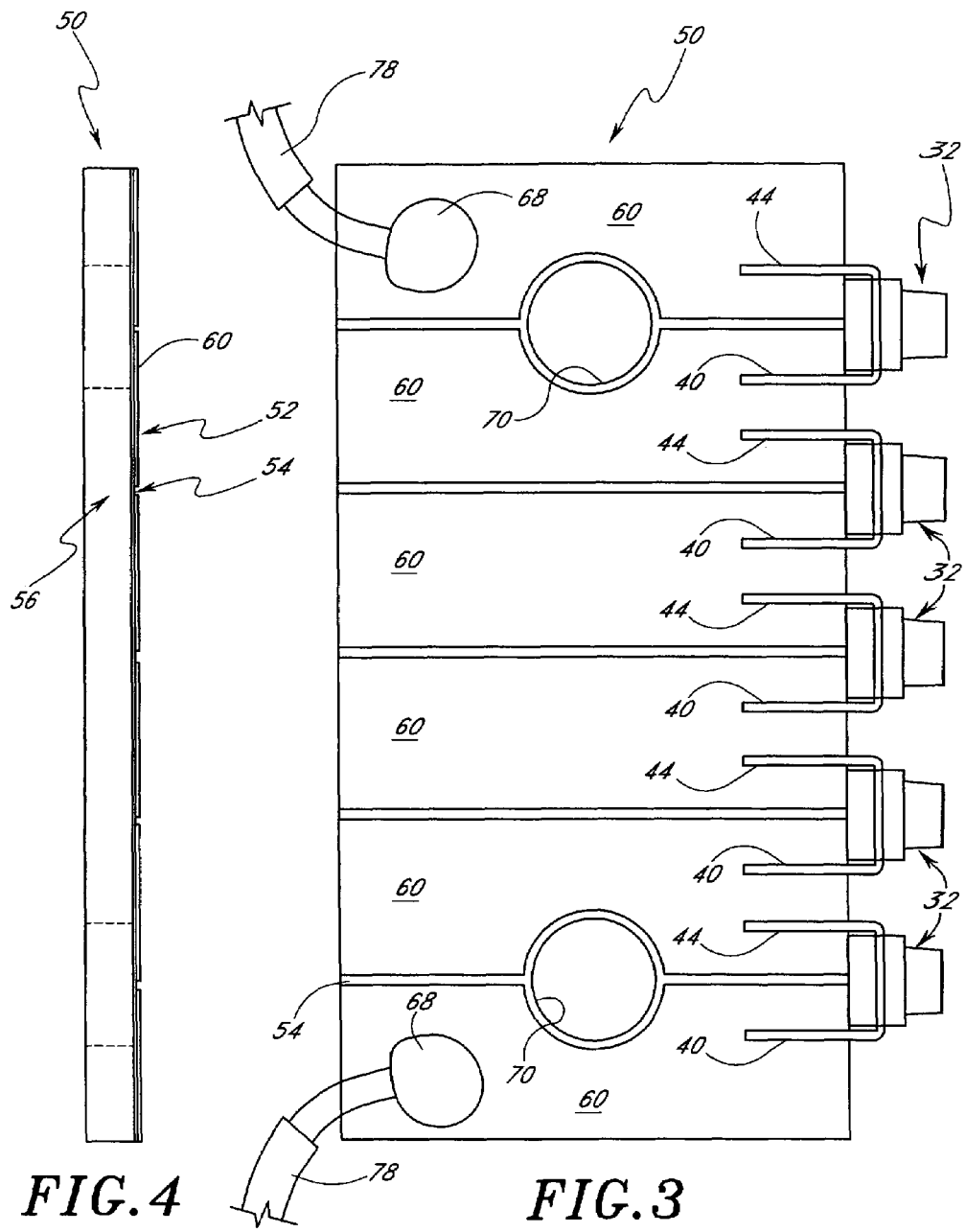

MODULAR MOUNTING ARRANGEMENT AND METHOD FOR LIGHT EMITTING DIODES

RELATED APPLICATIONS

This application is a continuation of U.S. application Ser. No. 10/909,933, which was filed on Aug. 2, 2004, now U.S. Pat. No. 7,108,396 which is a continuation of U.S. application Ser. No. 10/417,896, now U.S. Pat. No. 6,846,093, which was filed on Apr. 16, 2003, which is a continuation of U.S. application Ser. No. 09/948,338, now U.S. Pat. No. 6,578,986, which was filed on Sep. 5, 2001, and which claims priority to U.S. Application Ser. No. 60/301,951, which was filed on Jun. 29, 2001. The entirety of each of these related applications is hereby incorporated by reference.

BACKGROUND OF THE INVENTION

1. Field of the Invention

The present invention relates generally to light emitting diode (LED) lighting devices and more particularly to LED lighting modules having heat transfer properties that improve the efficiency and performance of LEDs.

2. Description of the Related Art

Most lighting applications utilize incandescent or gas-filled bulbs, particularly lighting applications that require more than a low level of illumination. Such bulbs typically do not have long operating lifetimes and thus require frequent replacement. Gas-filled tubes, such as fluorescent or neon tubes, may have longer lifetimes, but operate using dangerously high voltages and are relatively expensive. Further, both bulbs and gas-filled tubes consume substantial amounts of power.

In contrast, light emitting diodes (LEDs) are relatively inexpensive, operate at low voltage, and have long operating lifetimes. Additionally, LEDs consume relatively little power and are relatively compact. These attributes make LEDs particularly desirable and well suited for many applications. However, one limitation of LEDs is that they typically do not provide sufficient brightness for applications that need more than low level illumination.

Although it is known that the brightness of the light emitted by an LED can be increased by increasing the electrical current supplied to the LED, increased current also increases the junction temperature of the LED. Increased junction temperature may reduce the efficiency and the lifetime of the LED. For example, it has been noted that for every 10° C. increase in temperature above a specified temperature, the operating lifetime of silicone and gallium arsenide drops by a factor of 2.5-3. LEDs are often constructed of semiconductor materials that share many similar properties with silicone and gallium arsenide.

Another factor in the use of LEDs is that, in most systems, a series of LEDs must be connected together and mounted on a surface. Such connection and mounting is typically a time consuming, laborious process.

Accordingly, there is a need in the art for a convenient and efficient arrangement for mounting LEDs on a surface. There is also a need in the art for lighting systems utilizing LEDs that provide illumination at levels which are more comparable to those of incandescent bulbs and gas-filled tubes.

SUMMARY OF THE INVENTION

The present lighting system is directed, inter alia, to a mounting arrangement for LEDs, which in the preferred embodiment may be adapted to allow for increased LED brightness.

In accordance with one embodiment, a lighting system is provided comprising a plurality of lighting modules adapted to be mounted on a surface of a heat conductive member. Each module comprises a plurality of light emitting diodes (LEDs) and a plurality of electrically conductive contacts. Each of the LEDs electrically communicates with at least one of the contacts in a manner so that the LEDs are configured in a series array between opposing first and second edges of the module. A dielectric layer is provided and has a first side and a second side. The contacts are connected to the first side of the dielectric layer. Each of the modules further includes an adhesive layer adapted to fasten the module to a surface of a heat conductive member such that heat from the module is drawn into the heat conductive member through the adhesive.

In accordance with another embodiment, a method of making an illuminated signage system is provided. According to the method, a sign member is provided configured according to a desired illumination shape. A plurality of light emitting diode (LED) modules is provided. Each of the LED modules comprises a plurality of LEDs; a plurality of electrically conductive contacts, each of the LEDs electrically communicating with at least one of the contacts; a dielectric layer having a first side and a second side, the contacts being connected to the first side; and a heat conductive body communicating with the second side of the dielectric layer. The heat conductive body is configured to absorb heat generated by the LEDs. An adhesive portion is provided and is configured to connect the LED module to the sign member. The heat conductive body is disposed between the dielectric layer and the attachment portion. The plurality of LED modules is electrically connected to each other, and the adhesive portion of each module is adhered to a surface of the sign member.

In accordance with yet another aspect, a lighting system comprises a plurality of lighting modules adapted to be mounted on a surface of a heat conductive member. Each module comprises a plurality of light emitting diodes (LEDs); a plurality of electrically conductive contacts, each of the LEDs electrically communicating with at least one of the contacts in a manner so that the LEDs are configured in a series array between opposing first and second edges of the module; and a dielectric layer having a first side and a second side, the contacts being connected to the first side. A first electrically conductive power trace and a second electrically conductive power trace are disposed on the first side of the dielectric layer. A first one of the contacts is electrically connected to the first trace, and a second one of the contacts is electrically connected to the second trace. The first contact is electrically connected to a positive lead of the series array of LEDs, and the second contact is electrically connected to a negative lead of the series array of LEDs. Each of the modules further includes an adhesive layer adapted to fasten the module to a surface of a heat conductive member such that heat from the module is drawn into the heat conductive member through the adhesive. Also, a plurality of modules are electrically interconnected in a manner so that the first and second power traces of a first module are connected to the first and second power traces of a second module.

In accordance with a still further embodiment, a method of making an illuminated signage system is provided. The method comprises providing a sign member configured according to a desired illumination shape and having a flat surface portion, and providing a plurality of light emitting diode (LED) modules that are electrically interconnected to each other in an electrically parallel arrangement. Each of the LED modules comprises at least one LED, a plurality of electrically conductive contacts, the at least one LED electrically communicating with at least one of the contacts, a dielectric layer having a first side and a second side, the contacts being disposed on the first side, and a heat conductive body communicating with the second side of the dielectric layer. The heat conductive body is configured to absorb heat generated by the at least one LED that flows through the dielectric layer. The heat conductive body also comprises a generally flat portion disposed generally opposite the dielectric layer. The method further comprises providing an adhesive member configured to connect the LED module to the flat surface portion of the sign member, at least part of the heat conductive body being disposed between the dielectric layer and the adhesive member, and adhering the adhesive member of each module to a surface of the sign member so that the generally flat portion of the heat conductive body is arranged generally complementary to the flat surface portion of the sign member.

For purposes of summarizing the present mounting arrangement and the advantages achieved over the prior art, certain advantages have been described herein above. Of course, it is to be understood that not necessarily all such advantages may be achieved in accordance with any particular embodiment. Thus, for example, those skilled in the art will recognize that the invention may be embodied or carried out in a manner that achieves or optimizes one advantage or group of advantages as taught herein without necessarily achieving other objects or advantages as may be taught or suggested herein.

All of these embodiments are intended to be within the scope of the invention. These and other embodiments will become readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

FIG. 3 is a top plan view of the LED module of FIG. 1.

FIG. 4 is a side plan view of the apparatus of FIG. 3.

DETAILED DESCRIPTION OF PREFERRED EMBODIMENTS

Figure 1:
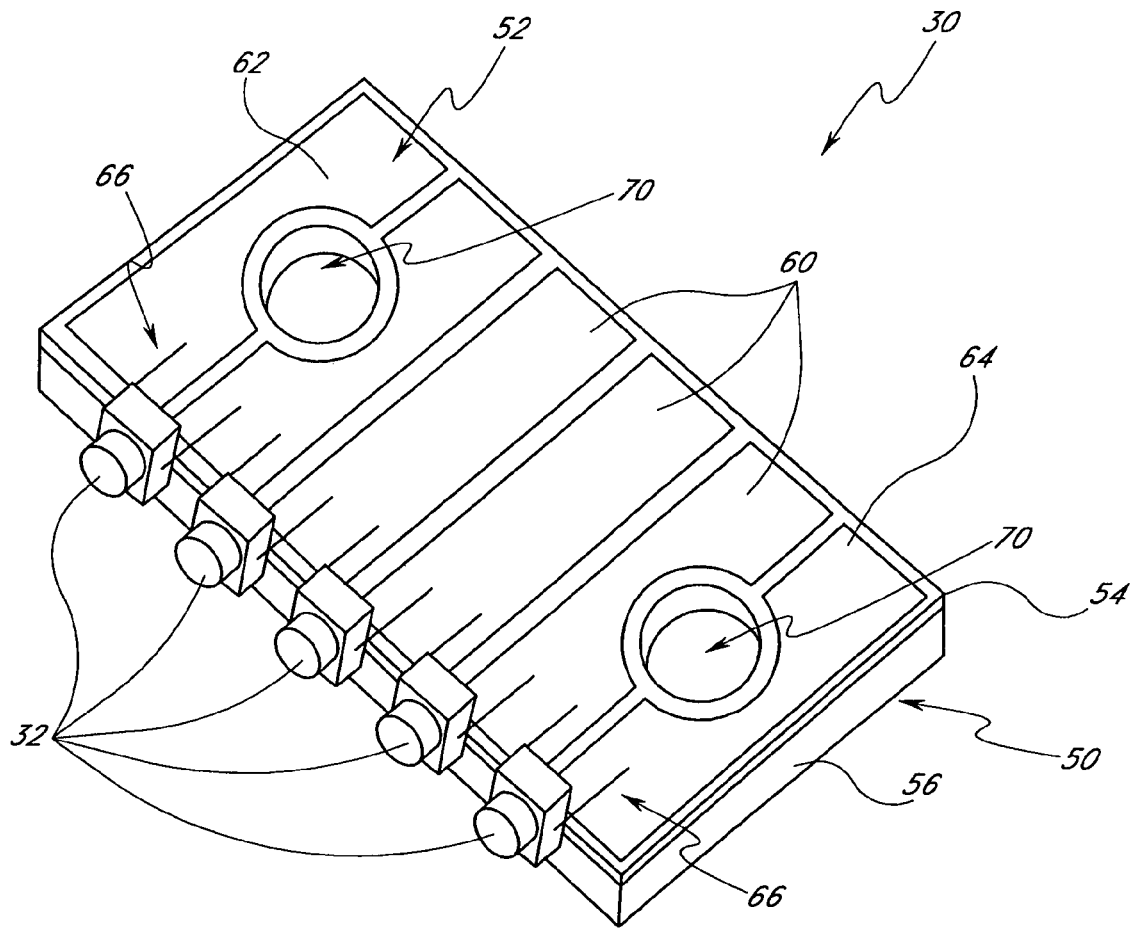
FIG. 1 is a perspective view of an LED module having features in accordance with an embodiment.

With reference first to FIG. 1, an embodiment of a light-emitting diode (LED) lighting module 30 is disclosed. In the illustrated embodiment, the LED module 30 includes five pre-packaged LEDs 32 arranged along a front edge of the module 30. It is to be understood, however, that LED modules can be constructed having any number of LEDs 32 mounted in any desired configuration.

Figure 2:
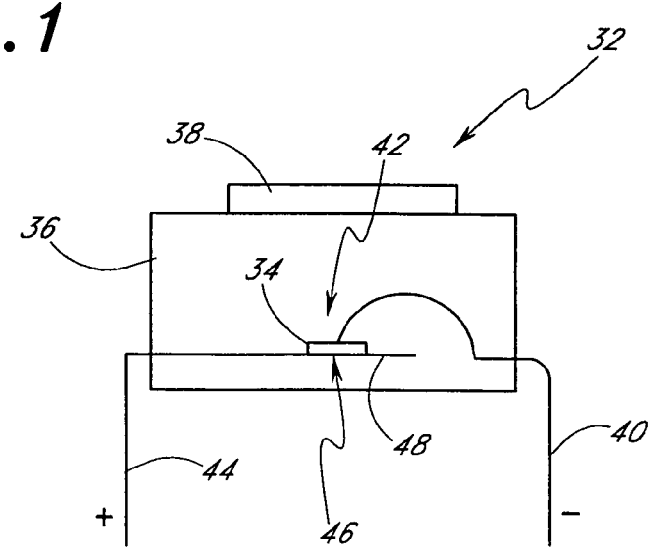
FIG. 2 is a schematic side view of a typical pre-packaged LED lamp.

With next reference to FIG. 2, a typical LED package 32 includes a diode chip 34 encased within a resin body 36. The LED package 32 typically has a focusing lens portion 38 on the body 36 and a pair of leads 40, 44, one of which is negative and the other positive. The negative lead 40 connects to an anode side 42 of the diode chip 34 and the positive lead 44 connects to a cathode side 46 of the diode chip 34. The positive lead 44 preferably includes a reflector portion 48 to help direct light from the diode 34 to the lens portion 38.

With next reference to FIGS. 1-5, the LED module 30 preferably comprises the five pre-packaged LED lamps 32 mounted in a linear array on a circuit board 50 and electrically connected in series. The LED lamps 32 may comprise Hewlett Packard model HLMT-PL00 lamps, which employ pre-packaged aluminum indium gallium phosphide (AlInGaP) chips 34. In the illustrated embodiment, each of the pre-packaged LEDs is substantially identical so that they emit the same color of light. It is to be understood, however, that nonidentical LEDs may be used to achieve certain desired lighting effects.

The illustrated circuit board 50 preferably is about 0.05 inches thick, 1 inch long and 0.5 inch wide. It includes three layers: a copper contact layer 52, an epoxy dielectric layer 54 and an aluminum main body layer 56. The copper contact layer 52 is made up of a series of six elongate and generally parallel flat copper plates 60 that are adapted to attach to the leads 40, 44 of the LEDs 32. Each of the copper contacts 60 is electrically insulated from the other copper contacts 60 by the dielectric layer 54. Preferably, the copper contacts 60 are substantially coplanar.

The pre-packaged LEDs 32 are attached to one side of the circuit board 50, with the body portion 36 of each LED generally abutting a side of the circuit board 50. The LED lens portion 38 is thus pointed outwardly so as to direct light in a direction substantially coplanar with the circuit board 50. The LED leads 40, 44 are soldered onto the contacts 60 in a manner to create a series array of LEDs. Excess material from the leads of the individual pre-packaged LED lamps may be removed, if desired. Each of the contacts 60, except for the first and last contact 62, 64, have both a negative lead 40 and a positive lead 44 attached thereto. One of the first and last contacts 62, 64 has only a negative lead 40 attached thereto; the other has only a positive lead 44 attached thereto.

A bonding area 66 of the contacts accommodates the leads 40, 44, which are preferably bonded to the contact 60 with solder 68; however, each contact 60 preferably has a surface area much larger than is required for bonding in the bonding area 66. The enlarged contact surface area allows each contact 60 to operate as a heat sink, efficiently absorbing heat from the LED leads 40, 44. To maximize this role, the contacts 60 are shaped to be as large as possible while still fitting upon the circuit board 50.

The dielectric layer 54 preferably has strong electrical insulation properties but also relatively high heat conductance properties, and is preferably as thin as practicable. For example in the illustrated embodiment, the dielectric layer 54 comprises a layer of Thermagon® epoxy about 0.002 inches thick.

It is to be understood that various materials and thicknesses can be used for the dielectric layer 54. Generally, the lower the thermal conductivity of the material used for the dielectric layer, the thinner that dielectric layer should be in order to maximize the heat transfer properties of the module. Nevertheless, even when a material such as Thermagon® epoxy, which has high thermal conductivity, is used, the dielectric layer is preferably as thin as practicable in order to minimize thermal resistance. Certain ceramic materials, such as beryllium oxide and aluminum nitride, are electrically non-conductive but highly thermally conductive. Such materials, and still other materials, can also be acceptably used for the dielectric layer.

In the illustrated embodiment, the main body 56 makes up the bulk of the thickness of the circuit board 50 and preferably comprises a flat aluminum plate. As with each of the individual contacts 60, the main body 56 functions as a heat conduit, absorbing heat from the contacts 60 through the dielectric layer 54 in order to conduct heat away from the LEDs 32. However, rather than just absorbing heat from a single LED 32, the main body 56 acts as a common heat conduit, absorbing heat from all of the contacts 60. As such, in the illustrated embodiment, the surface area of the main body 56 is about the same as the combined surface area of all of the individual contacts 60. The main body 56 can be significantly larger than shown in the illustrated embodiment, but its relatively compact shape is preferable in order to increase versatility when mounting the light module 30. Additionally, the main body 56 is relatively rigid and provides structural support for the lighting module 30.

In the illustrated embodiment, the main body 56 is made of aluminum, which has high thermal conductance properties and is easy to work with during manufacture. It is to be understood, however, that any material having advantageous thermal conductance properties, such as having thermal conductivity greater than about 100 watts per meter per Kelvin (W/m*K), would be acceptable.

In the illustrated embodiment, a pair of holes 70 are formed through the circuit board 50 and are adapted to accommodate a pair of aluminum pop rivets 72. The pop rivets 72 hold the circuit board 50 securely onto a heat conductive mount member 76. The mount member 76 functions as or communicates with a heat sink. Thus, heat from the LEDs 32 is conducted with relatively little resistance through the module 30 to the attached heat sink 76 so that the junction temperature of the diode chip 34 within the LED 32 does not exceed a maximum desired level.

With reference again to FIGS. 3 and 5, power supply wires 78 are attached across the first and last contacts 62, 64 of the circuit board 50 so that electrical current is provided to the series-connected LEDs 32. The power supply is preferably a 12-volt system and may be AC, DC or any other suitable power supply. A 12-volt AC system may be fully rectified.

The small size of the LED module 30 provides versatility so that a plurality of modules can be mounted at various places and in various configurations. For instance, some applications will include only a single module for a particular lighting application, while other lighting applications will employ a plurality of modules electrically connected in parallel relative to each other.

It is also to be understood that any number of LEDs can be included in one module. For example, some modules may use two LEDs, while other modules may use 10 or more LEDs. One manner of determining the number of LEDs to include in a single module is to first determine the desired operating voltage of a single LED of the module and also the voltage of the power supply. The number of LEDs desired for the module is then roughly equal to the voltage of the power supply divided by the operating voltage of each of the LEDs.

The present LED module 30 rapidly conducts heat away from the diode chip 34 of each LED 32 so as to permit the LEDs 32 to be operated in regimes that exceed normal operating parameters of the pre-packaged LEDs 32. In particular, the heat sinks allow the LED circuit to be driven in a continuous, non-pulsed manner at a higher long-term electrical current than is possible for typical LED mounting configurations. This operating current is substantially greater than manufacturer-recommended maximums. The optical emission of the LEDs at the higher current is also markedly greater than at manufacturer-suggested maximum currents.

The heat transfer arrangement of the LED modules 30 is especially advantageous for pre-packaged LEDs 32 having relatively small packaging and for single-diode LED lamps. For instance, the HLMT-PL00 model LED lamps used in the illustrated embodiment employ only a single diode, but since heat can be drawn efficiently from that single diode through the leads and circuit board and into the heat sink, the diode can be run at a higher current than such LEDs are traditionally operated. At such a current, the single-diode LED shines brighter than many LED lamps that employ two or more diodes and which are brighter than a single-diode lamp during traditional operation. Of course, pre-packaged LED lamps having multiple diodes can also be advantageously employed with the present modular mounting arrangement. It is also to be understood that the relatively small packaging of the model HLMT-PL00 lamps aids in heat transfer by allowing the heat sink to be attached to the leads closer to the diode chip.

Figure 5:
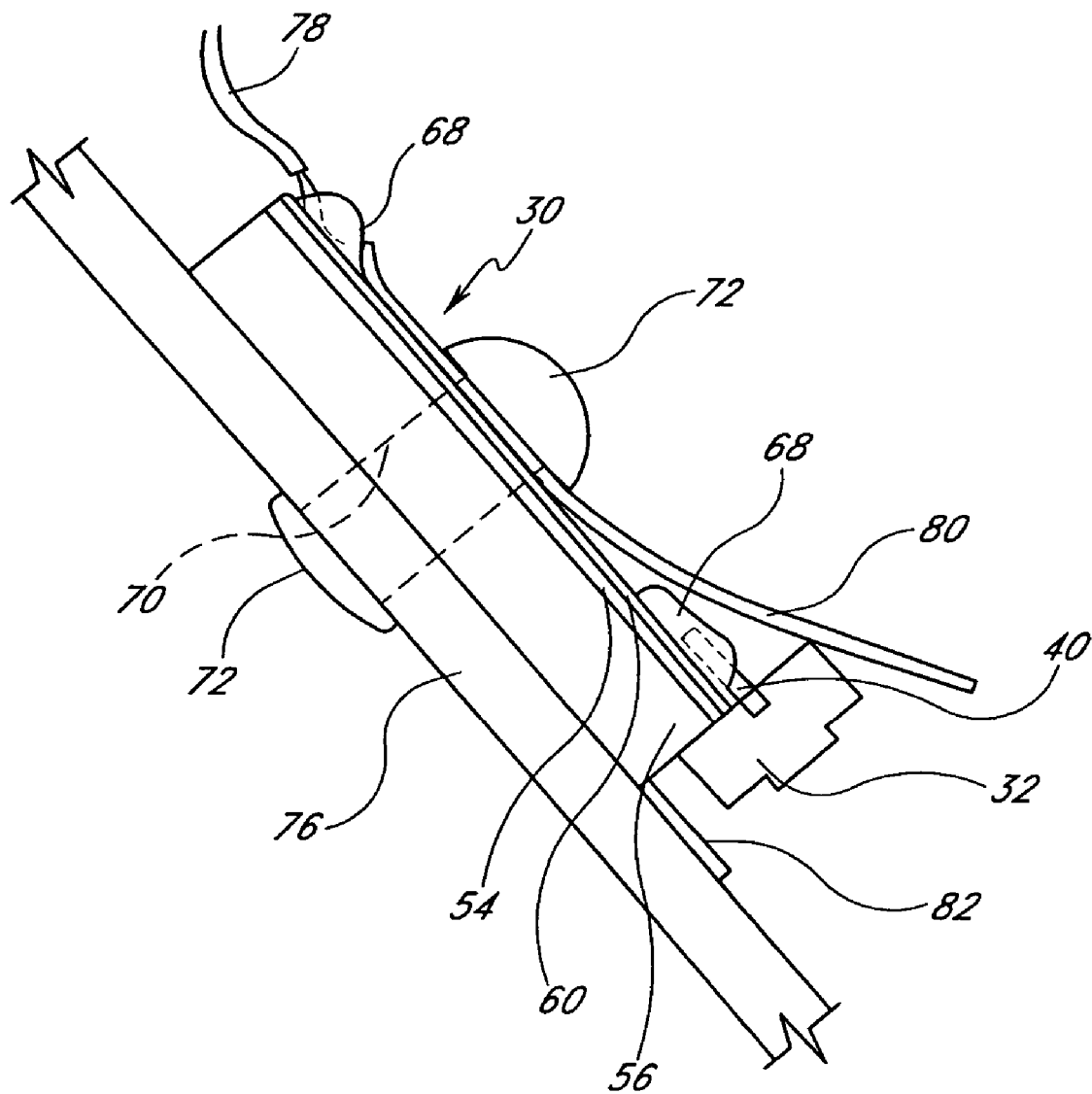
FIG. 5 is a close-up side view of the apparatus of FIG. 3 mounted on a heat conductive member.

With next reference to FIG. 5, a first reflective layer 80 is preferably attached immediately on top of the contacts 60 of the circuit board 50 and is held in position by the rivets 72. The first reflector 80 preferably extends outwardly beyond the LEDs 32. The reflective material preferably comprises an electrically non-conductive film such as visible mirror film, which is available from 3M. A second reflective layer 82 is preferably attached to the mount member 76 at a point immediately adjacent the LED lamps 32. The second strip 82 is preferably bonded to the mount surface 76 using adhesive in a manner known in the art.

Figure 6:
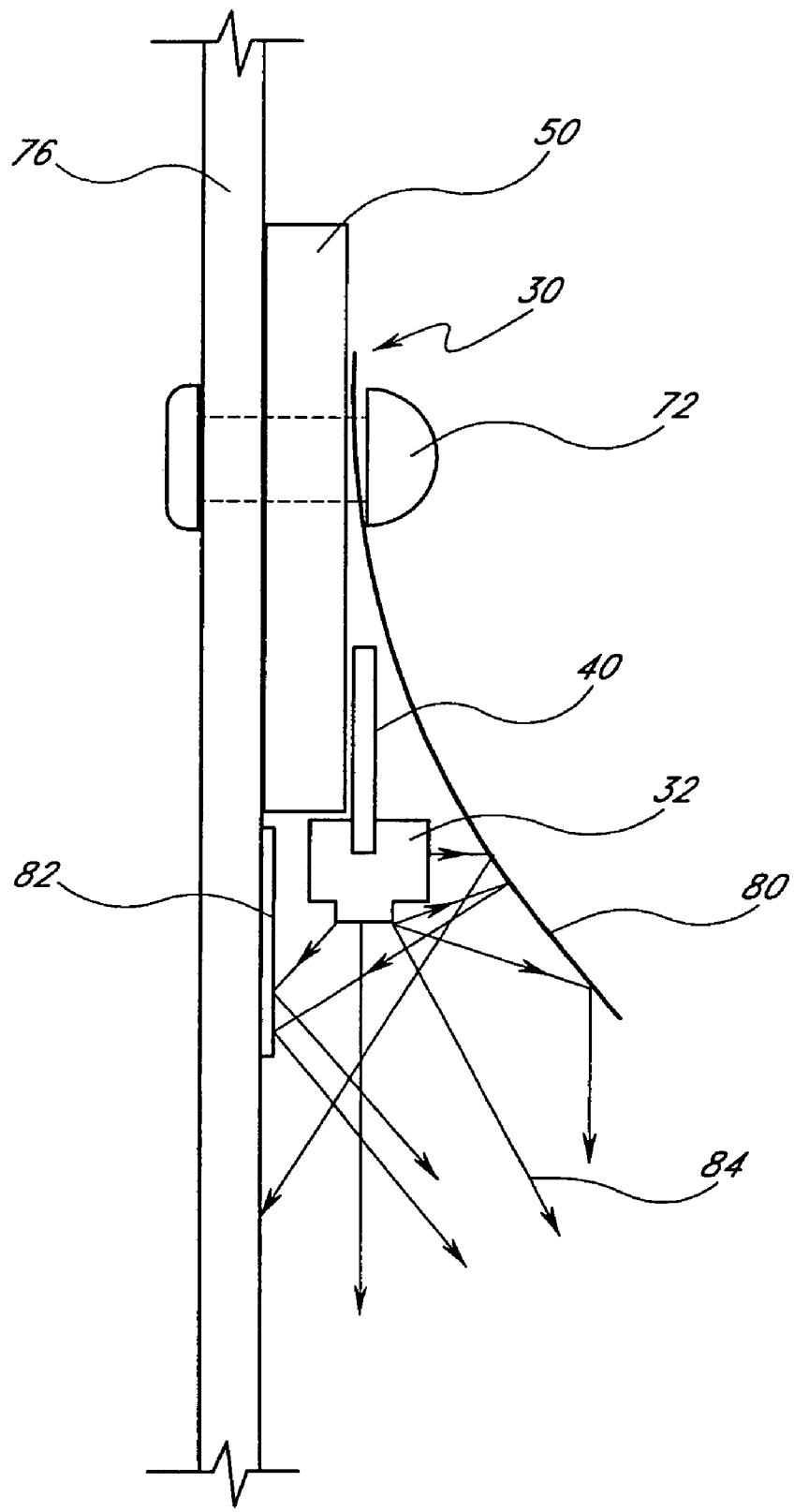
FIG. 6 is another sectional side view of the apparatus of FIG. 3 mounted onto a heat conductive flat surface.

With reference also to FIG. 6, the first reflective strip 80 is preferably bent so as to form a convex reflective trough about the LEDs 32. The convex trough is adapted to direct light rays emitted by the LEDs 32 outward with a minimum of reflections between the reflector strips 80, 82. Additionally, light from the LEDs is limited to being directed in a specified general direction by the reflecting films 80, 82. As also shown in FIG. 6, the circuit board 50 can be mounted directly to any mount surface 76.

In another embodiment, the aluminum main body portion 56 may be of reduced thickness or may be formed of a softer metal so that the module 30 can be at least partially deformed by a user. In this manner, the module 30 can be adjusted to fit onto various surfaces, whether they are flat or curved. By being able to adjust the fit of the module to the surface, the shared contact surface between the main body and the adjacent heat sink mount surface is maximized, thus improving heat transfer properties. Additional embodiments can use fasteners other than rivets to hold the module into place on the mount surface/heat sink material. These additional fasteners can include any known fastening means such as welding, heat-conductive adhesives, and the like.

Figure 7:
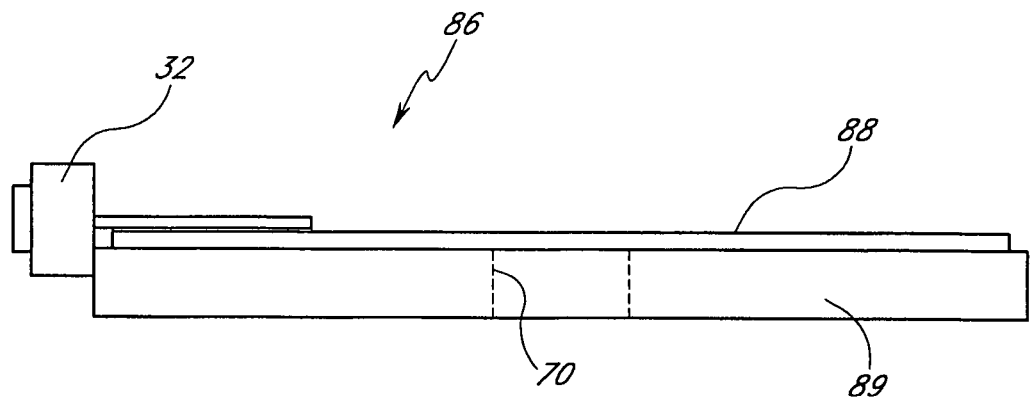
FIG. 7 is a side plan view of an LED module having features in accordance with another embodiment.

As discussed above, a variety of materials can be used for the circuit board portion of the LED module. With specific reference to FIG. 7, another embodiment of an LED module 86 comprises a series of elongate, flat contacts 88 similar to those described above with reference to FIG. 3. The contacts 88 are mounted directly onto the main body portion 89. The main body 89 comprises a rigid, substantially flat ceramic plate. The ceramic plate makes up the bulk of the circuit board and provides structural support for the contacts 88. Also, the ceramic plate has a surface area about the same as the combined surface area of the contacts. In this manner, the plate is large enough to provide structural support for the contacts 88 and to conduct heat away from each of the contacts 88, but is small enough to allow the module 86 to be relatively small and easy to work with. The ceramic plate 89 is preferably electrically non-conductive but has high heat conductivity. Thus, the contacts 88 are electrically insulated relative to each other, but heat from the contacts 88 is readily transferred to the ceramic plate 89 and into an adjacent heat sink.

Figure 8:
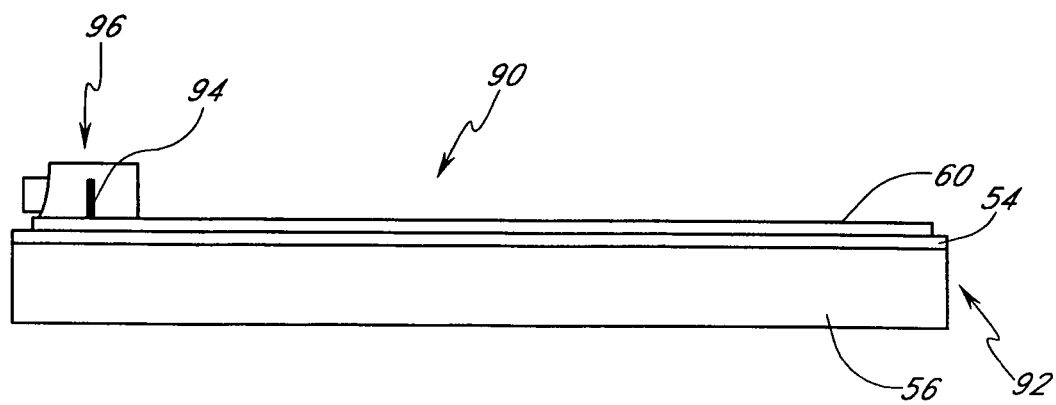
FIG. 8 is a side plan view of another LED module having features in accordance with yet another embodiment.

With next reference to FIG. 8, another embodiment of an LED lighting module 90 is shown. The LED module 90 comprises a circuit board 92 having features substantially similar to the circuit board 50 described above with reference to FIG. 3. The diode portion 94 of an LED 96 is mounted substantially directly onto the contacts 60 of the lighting module 90. In this manner, any thermal resistance from leads of pre-packaged LEDs is eliminated by transferring heat directly from the diode 94 onto each heat sink contact 60, from which the heat is conducted to the main body 56 and then out of the module 90. In this configuration, heat transfer properties are yet further improved.

With reference next to FIGS. 9-12, another embodiment of an LED module 100 is illustrated. As with the LED module 30 discussed above, the LED module 100 preferably comprises a circuit board 50 which includes a contact layer 52, a dielectric layer 54, and a main body layer 56. The contact layer 52 includes a series of electrical traces and contacts, as will be discussed in further detail below. The dielectric layer 54 electrically insulates the traces and contacts relative to one another. The main body layer 56 provides support and helps thermally conduct heat away from the contact layer 52 and dielectric layer 54.

Figure 9:
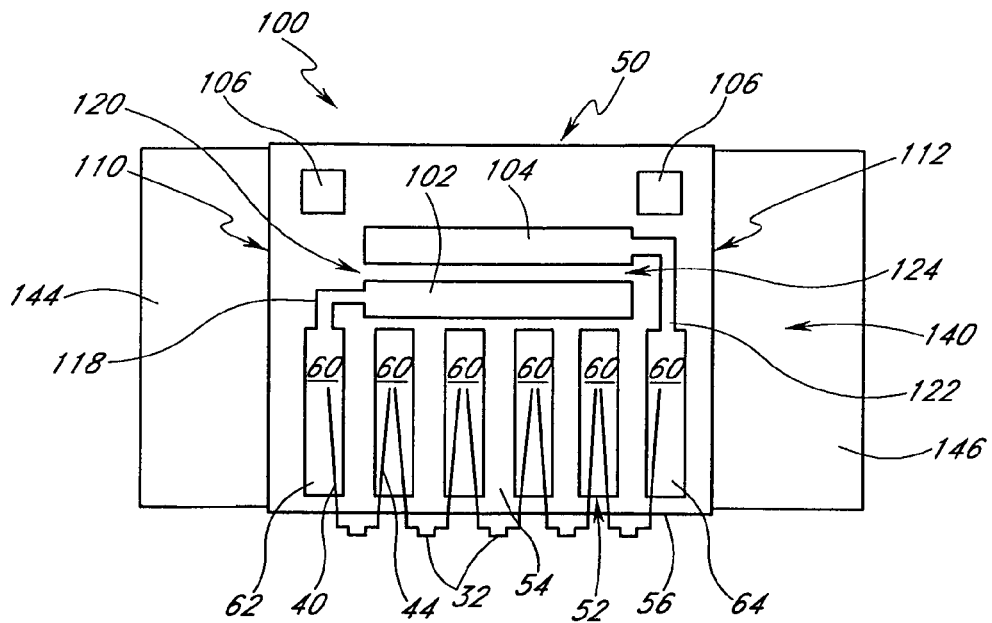
FIG. 9 is a plan view of yet another embodiment of an LED module.

As best shown in FIG. 9, which shows a plan view of the contact layer 52, the contact layer 52 comprises a series of six contacts 60, which comprise elongate and generally parallel electrically conductive flat plates. Leads 40, 44 of five LEDs 32 attach to the contacts 60 so as to form a linear array of the five prepackaged LEDs 32, which are arranged in series relative to one another.

First and second elongate power traces 102, 104 extend in a direction generally transverse to the parallel plates 60, but parallel to the series array. As with the contacts 60, the power traces 102, 104 comprise conductive material, and are electrically insulated from each other and the contacts by the dielectric layer 54. Secondary connecting portions 106 are also provided adjacent first and second side edges 110, 112 of the circuit board 50. The secondary connecting portions 106 are also electrically insulated from the contacts 60 and power traces 102, 104 by the dielectric layer 54.

A first connector trace 118 extends between the first contact 62 and a first end 120 of the first power trace 102. A second connection trace 122 extends between the last contact 64 and a second end 124 of the second power trace 104. The connector traces 118, 122 place their respective contacts 62, 64 into electrical communication with the corresponding power traces 102, 104.

Figure 10:
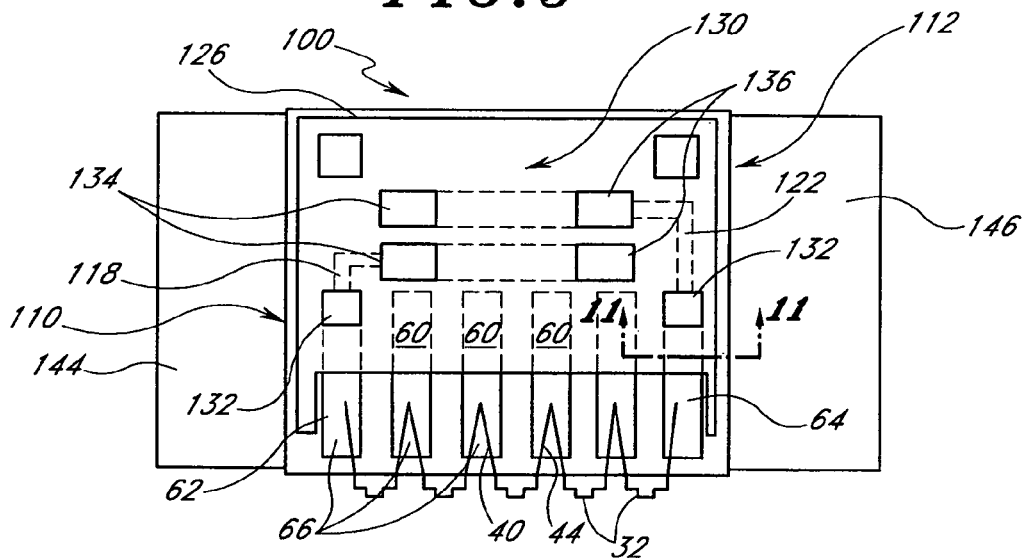
FIG. 10 shows the LED module of FIG. 9 including a masking layer.
Figure 11:
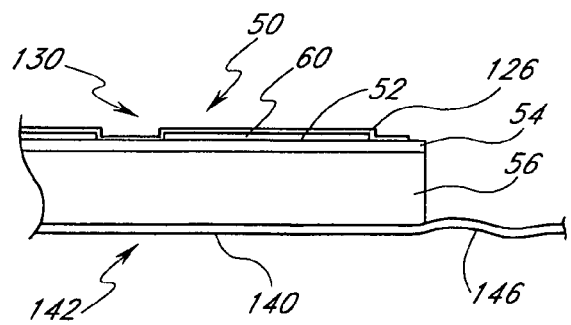
FIG. 11 is a sectional view of the LED module of FIG. 10 taken along line 11-11.

FIG. 10 shows a view similar to FIG. 9, except that a thin mask layer 126 is applied to selected portions of a top face 130 of the circuit board 50. FIG. 11 is a sectional view showing layers of the module 100. The masking layer 126 covers certain portions of the contacts 60 and traces 102, 104, 118, 122. These covered portions are depicted in phantom lines in FIG. 10. Other portions of the contacts and traces are left uncovered in order to function as solder points so as to facilitate electrical connection with certain other components. The masking layer 126 fulfills an aesthetic function and also protects areas of the contacts that are not used for electrical connections from environmental factors.

With continued reference to FIGS. 10 and 11, the mask layer 126 covers a portion of each of the contacts 60. However, each of the contacts 60 has a connecting area 66 which is not covered and which accommodates the leads 40, 44 of the associated LEDs 32. A connecting portion 132 of both the first and last contacts 62, 64 is also not covered by the mask layer 126. The mask layer 126 covers portions of each power trace 102, 104. A first end connecting portion 134 of each power trace 102, 104 is provided at the end closest to the first side edge 110 of the circuit board 50. Similarly, a second end connecting portion 136 of each power trace 102, 104 is provided at the end closest to the second side edge 112 of the circuit board 50. The mask layer 126 does not cover the power traces in the connecting portions 134, 136. First and second flexible conductors such as wires 114, 116 (see FIG. 19) can be connected to the connecting portions 134, 136 in order to supply power to the LED array.

Figure 12:
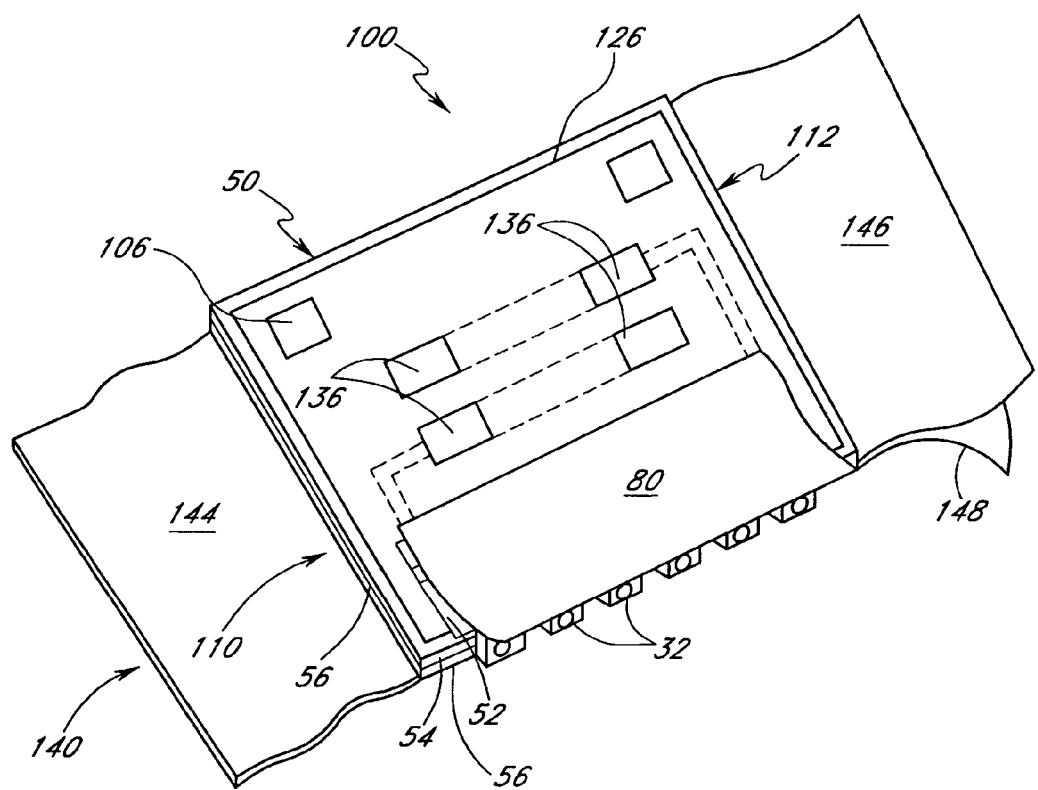
FIG. 12 is a perspective view of the LED module of FIG. 10, showing a reflective strip included thereon.

With reference also to FIG. 12, a layer of adhesive tape 140 is attached to a bottom face 142 of the LED module 100. As shown, the tape 140 preferably extends across the bottom face 142 and outwardly from the first and second opposing side edges 110, 112 of the circuit board 50, creating first and second flaps or ears 144, 146 of the tape 140. The tape 140 preferably is malleable and can be bent easily. A backing 148 is provided on the tape 140. The backing 148 can be peeled away to expose an adhesive layer, and the tape/module can be applied to a desired surface in a manner so that the module 100 is held securely in place on that surface.

A reflective layer 80 is also preferably attached to the circuit board 50. The reflective layer 80 is preferably held onto the circuit board 50 by a strip of adhesive operating between the mask layer 126 and the reflective cover 80. The reflective cover 80 preferably extends over the LEDs 32 in a manner as discussed above.

Figure 13:
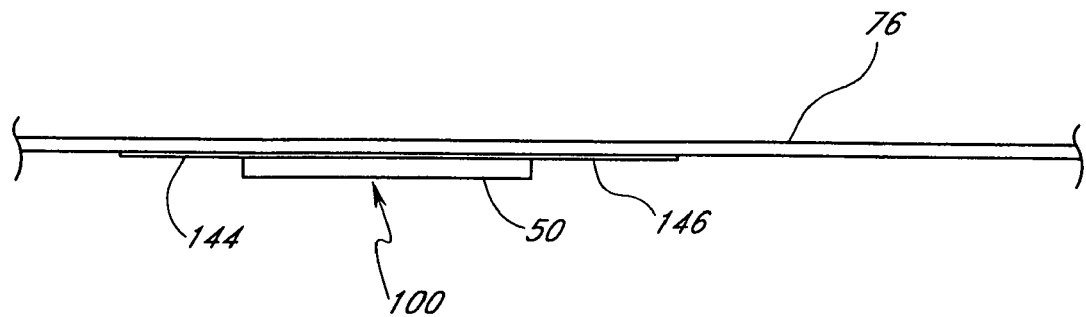
FIG. 13 is a side view of the LED module of FIG. 9 mounted on a flat surface.
Figure 14:
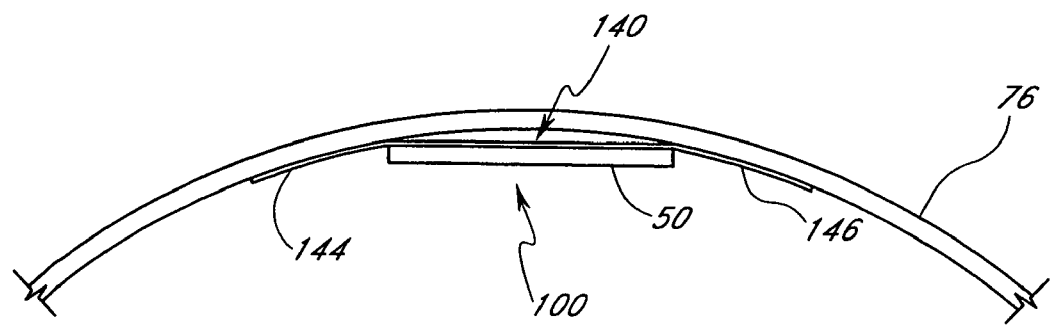
FIG. 14 is a close-up side view of the LED module of FIG. 9 mounted on a curving surface.

With next reference to FIGS. 13 and 14, the adhesive tape 140 secures a module 100 onto either a flat or a curved surface 76. In the case of a curved surface, if the module cannot bend sufficiently to keep the module in continuous contact with the curved surface, the flaps or ears of the tape will still be able to securely attach the module onto the curved surface. Of course, it is to be understood that the tape layer 140 can be provided with or without the ears 144, 146, and that the ears can be of any desired size and shape.

As mentioned, the LED module 100 has good heat transfer properties. The adhesive tape 140 preferably has properties that complement the heat transfer properties of the module. In one embodiment, the tape 140 comprises an aluminum tape having a heat-conductive adhesive applied thereto. The aluminum tape is capable of conforming to a curving or undulating surface, and also efficiently transfers heat from the module to the surface onto which it is attached. This aspect proves especially valuable when the module 100 is affixed to a curving heat sink surface 76, as shown in FIG. 14, and a large proportion of the module's circuit board 50 does not directly contact the curving surface. In such an instance, heat from the circuit board 50 flows through the ears 144, 146 to the heat sink 76.

In still another embodiment, the LED module's main body is formed of a bendable material, which allows the module to fit more closely and easily to a curved wall surface.

As discussed above, an LED module having features of the embodiments described above can be used in many applications such as, for example, indoor and outdoor decorative lighting, commercial lighting, spot lighting, and even room lighting. Such LED modules can also be used in applications using a plurality of such modules to appropriately light a lighting apparatus such as a channel illumination device 160 (see FIG. 15). Channel illumination devices are frequently used for signage including borders and lettering. In these devices, a wall structure outlines a desired shape to be illuminated, with one or more channels defined between the walls. A light source is mounted within the channel and a planar translucent diffuser is usually arranged at the top edges of the walls so as to enclose the channel. In this manner, a desired shape can be illuminated in a desired color as defined by the color of the lens and/or the LEDs.

Figure 15:
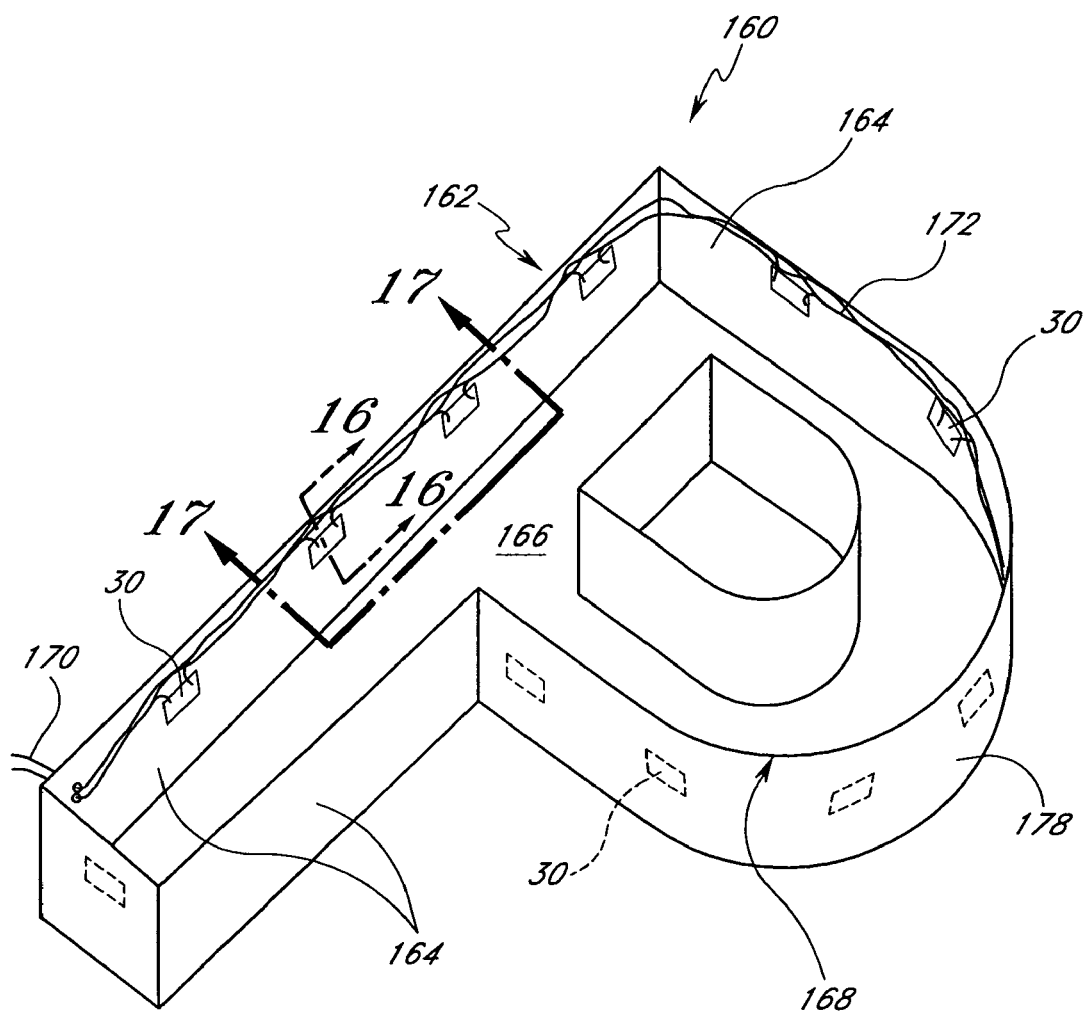
FIG. 15 is a perspective view of a channel illumination apparatus incorporating LED modules.

With reference next to FIG. 15, an embodiment of a channel illumination apparatus 160 is disclosed comprising a casing 162 in the shape of a "P." The casing 162 includes a plurality of walls 164 and a bottom 166, which together define at least one channel. The surfaces of the walls 164 and bottom 166 are diffusely-reflective, preferably being coated with a flat white coating. The walls 164 are preferably formed of a durable sturdy metal having relatively high heat conductivity. In the illustrated embodiment, a plurality of LED lighting modules 30 are mounted to the walls 164 of the casing 162 in a spaced-apart manner. A translucent light-diffusing lens (not shown) is preferably disposed on a top edge 168 of the walls 164 and encloses the channel.

Figure 16:
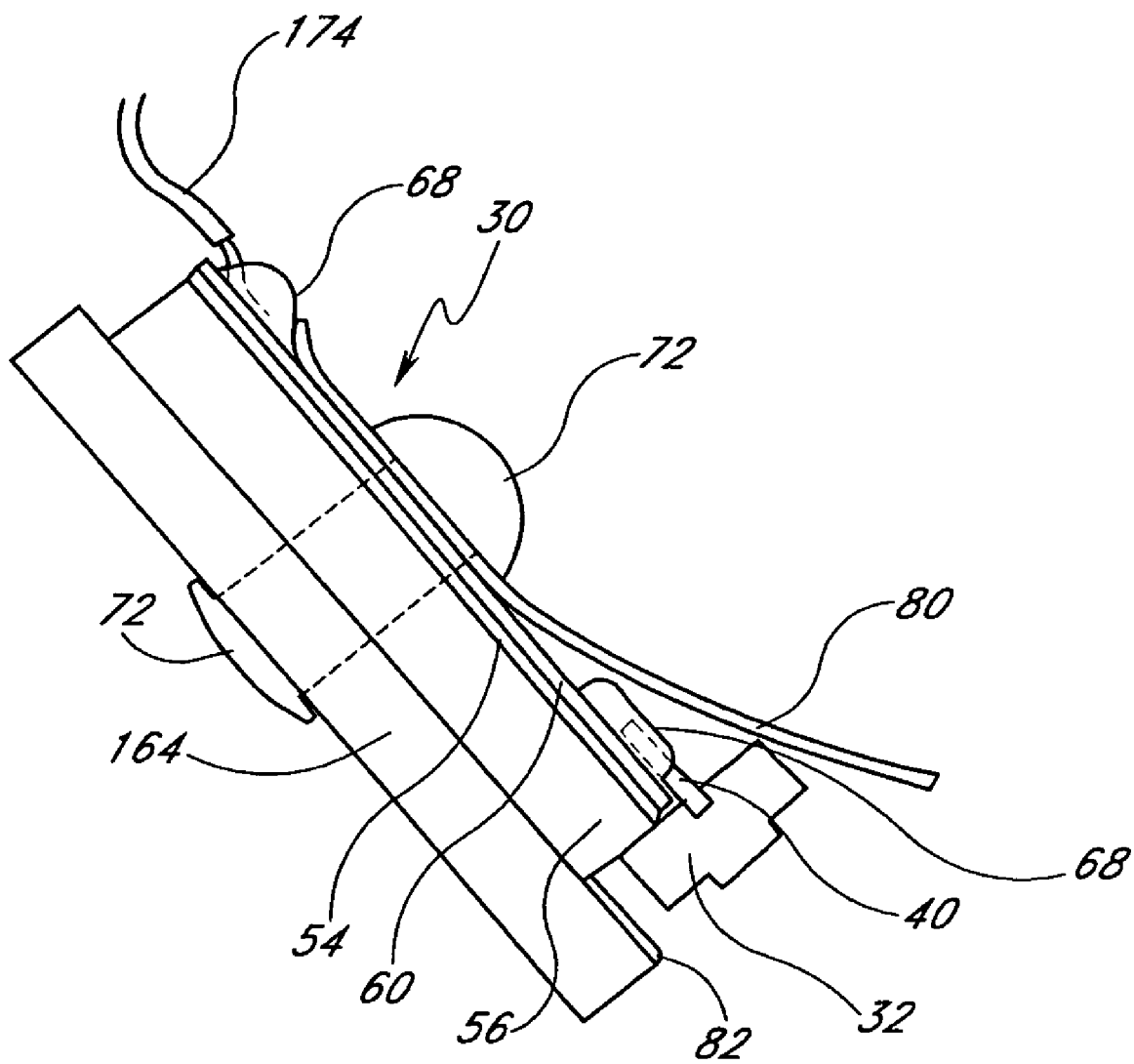
FIG. 16 is a cross-sectional side view taken along line 16-16 of FIG. 14.

With next reference also to FIG. 16, the LED module 30 is held securely onto the walls 164 of the channel apparatus by pop rivets 72, or any other fastening means. Preferably, the connection of the module 30 to the walls 164 facilitates heat transfer from the module 30 to the wall 164. The channel has a relatively large surface area, facilitating efficient heat transfer to the environment and enabling the channel wall 164 to function as a heat sink.

Figure 17:
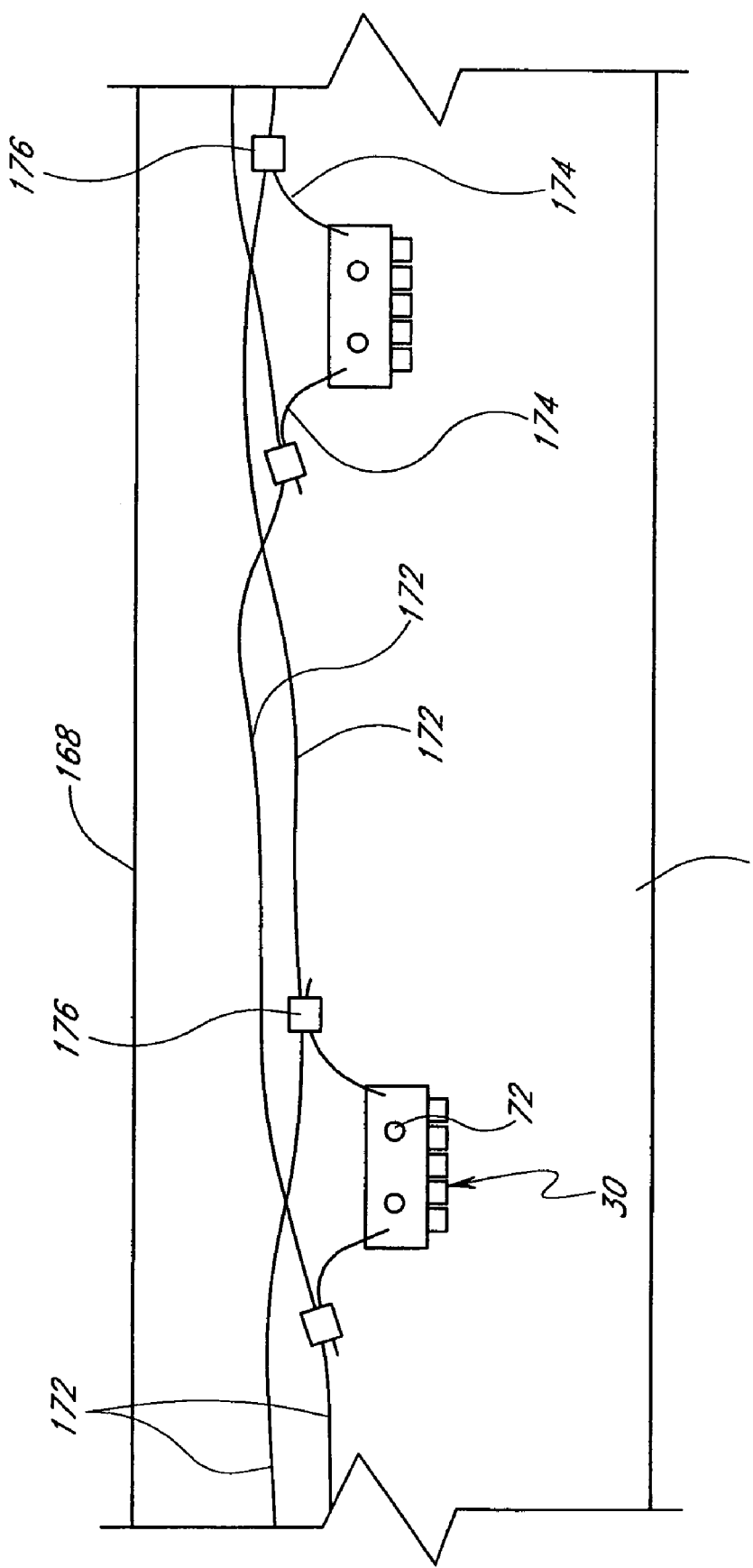
FIG. 17 is a partial view of a wall of the apparatus of FIG. 15, taken along line 17-17.

With continued reference to FIGS. 15-17, the LED modules 30 are preferably electrically connected in parallel relative to other modules 30 in the illumination apparatus 160. A power supply cord 170 preferably enters through one of the walls 164 or the bottom surface 166 of the casing 162 and preferably comprises two 18 AWG main conductors 172. Short wires 174 are attached to the first and last contacts 62, 64 of each module 30 and preferably connect with respective main conductors 172 using insulation displacement connectors (IDCs) 176 as shown in FIG. 17.

Although the LEDs 32 in the modules 30 are operated at electrical currents higher than typical pre-packaged LEDs, the power efficiency characteristic of LEDs is retained. For example, a channel illumination apparatus 160 using a plurality of LED modules might be expected to use about 4.5 watts of power.

With reference still to FIG. 17, the LED modules 30 are preferably positioned so that the LEDs 32 face generally downwardly, directing light away from the diffuser. The light is preferably directed to the diffusely-reflective wall and bottom surfaces 164, 166 of the casing 162. By directing the light away from the diffuser, "hot spots" that are associated with more direct forms of lighting, such as typical incandescent and gas-filled bulb arrangements, are avoided.

The reflectors 80, 82 of the LED modules 30 aid in directing light rays emanating from the LEDs toward the diffusely-reflective surfaces. It is to be understood, however, that an LED module 30 not employing reflectors, or employing only the first reflector 80, can also be appropriately used.

The relatively low profile of each LED module 30 facilitates the indirect method of lighting because substantially no shadow is created by the module when it is positioned on the wall 164. A higher-profile light module would cast a shadow on the lens, producing an undesirable, visibly darkened area. To minimize the potential of shadowing, it is desirable to space the modules 30 and accompanying power wires 172, 174 a distance of at least about ½ inch from the top edge 168 of the wall 164. More preferably, the modules 30 are spaced more than one inch from the top 168 of the wall 164.

The small size and low profile of the LED modules 30 enables the modules to be mounted at various places along the channel wall 164. For instance, with reference to FIGS. 15 and 18, light modules 30 must sometimes be mounted to curving portions 178 of walls 164. The illustrated modules 30 are about 1 inch to 1-½ inch long, and thus can be acceptably mounted to a curving wall 178.

In the embodiment shown in FIG. 15, the casing walls 164 are about 3 to 4 inches deep and the width of the channel is about 3 to 4 inches between the walls. In an apparatus of this size, LED modules 30 positioned on one side of the channel can provide sufficient lighting. The modules are preferably spaced about 5-6 inches apart. As may be anticipated, larger channel apparatus will likely require somewhat different arrangements of LED modules, including employing more LED modules. For example, a channel illumination apparatus having a channel width of 1 to 2 feet may employ LED modules on both walls and may even use multiple rows of LED modules. Additionally, the orientation of each of the modules may be varied in such a large channel illumination apparatus. For instance, some of the LED modules may desirably be angled so as to direct light at various angles relative to the diffusely reflective surfaces.

In order to avoid creating hot spots, a direct light path from the LED 32 to the diffuser preferably is avoided. However, it is to be understood that pre-packaged LED lamps having diffusely-reflective lenses may advantageously be directed toward the channel letter lens.

Individual LEDs emit generally monochromatic light. Thus, it is preferable that an LED type be chosen which corresponds to the desired illumination color of the lighting apparatus. Additionally, if a diffuser is used, the diffuser preferably is chosen to be substantially the same color as the LEDs. Such an arrangement facilitates desirable brightness and color results. It is also to be understood that the diffusely-reflective wall and bottom surfaces may be coated to match the desired illumination color.

Using LED modules 30 to illuminate a channel illumination apparatus 160 provides significant savings during manufacturing. For example, a number of LED modules, along with appropriate wiring and hardware, can be included in a kit which allows a technician to easily assemble a lighting apparatus by simply securing the modules in place along the wall of a casing and connecting the wiring appropriately using IDCs or the like. There is no need for custom shaping of the light source, as is required with gas-filled bulbs. Accordingly, manufacturing effort and costs are significantly reduced.

Of course, it is to be understood that LED modules having aspects of any of the embodiments of LED modules described above or below can be used in such a channel illumination apparatus, or similar devices.

Figure 19:
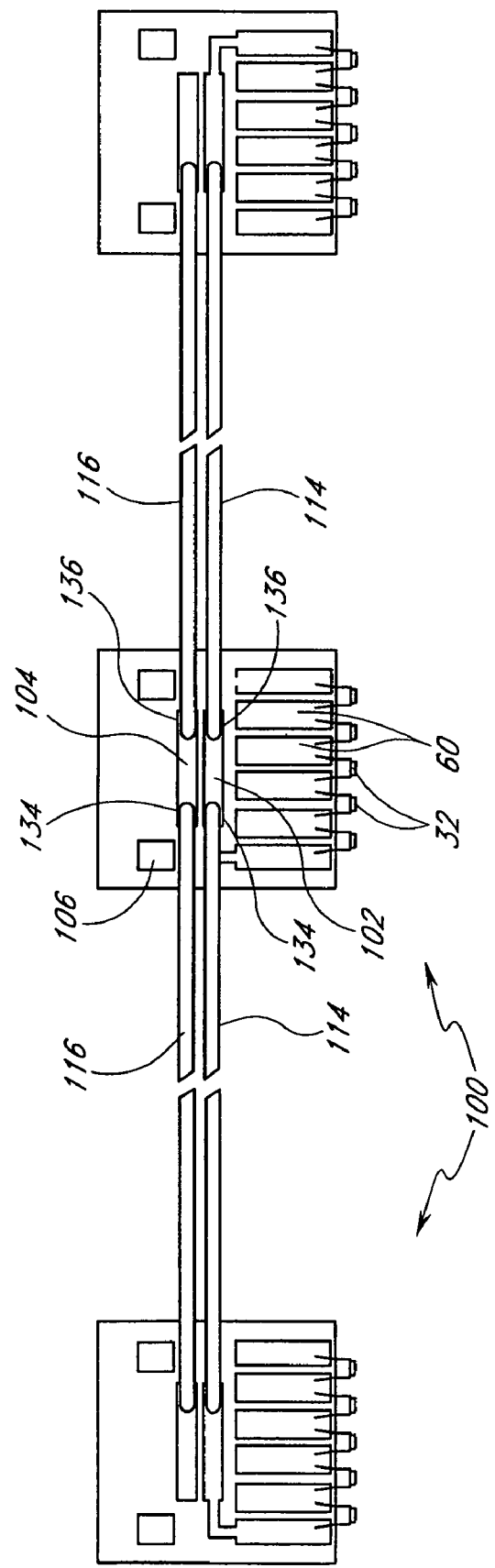
FIG. 19 shows a plurality of modules such as the LED module of FIG. 9 wired together.
Figure 20:
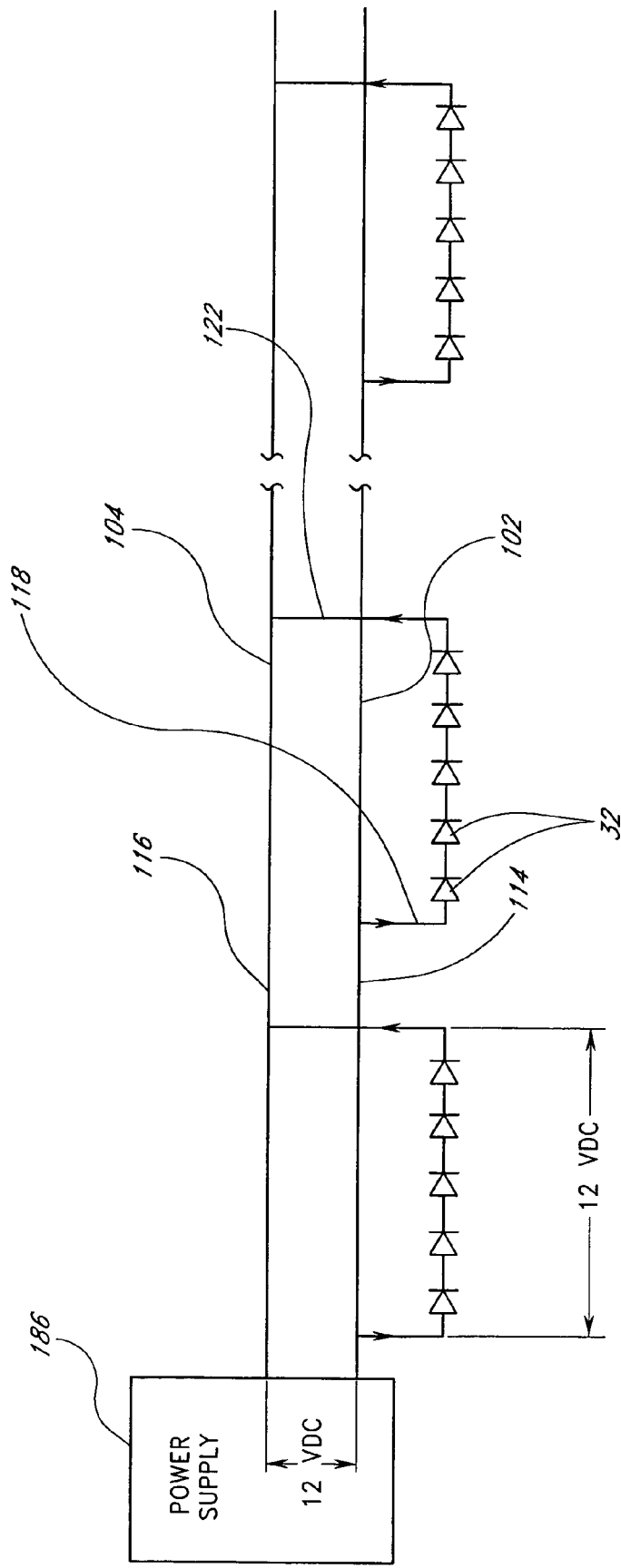
FIG. 20 is a circuit diagram showing the arrangement of FIG. 19 connected to a power supply.

With reference next to FIGS. 19 and 20, the power traces 102, 104 of the LED modules 100 discussed above with reference to FIGS. 9-14 are configured so that a plurality of modules 100 can easily be connected to one another by simply running a pair of relatively short wires 114, 116 between the power traces 102, 104 of each module 100 and soldering the wires 114, 116 in place on the power trace connecting portions 134, 136. As such, a plurality of LED modules 100 are wired together so that their corresponding LED series arrays are in an electrically parallel configuration.

With continued reference to FIG. 19, the wires 114, 116 preferably have the same length. As such, a plurality of modules 100 can be wired together to form a series or chain of such modules. Since the wires 114, 116 are the same length, the elongate series of modules is easy to mass produce with consistency. Preferably, the wires connect to the modules 100 at the connecting portions 134, 136 which are on generally opposing sides of the circuit board 50. In this manner, the module 100 is substantially longitudinally aligned with the associated flexible wires 114, 116. This arrangement provides a secure connection of the wires to the circuit board 50.

Figure 21:
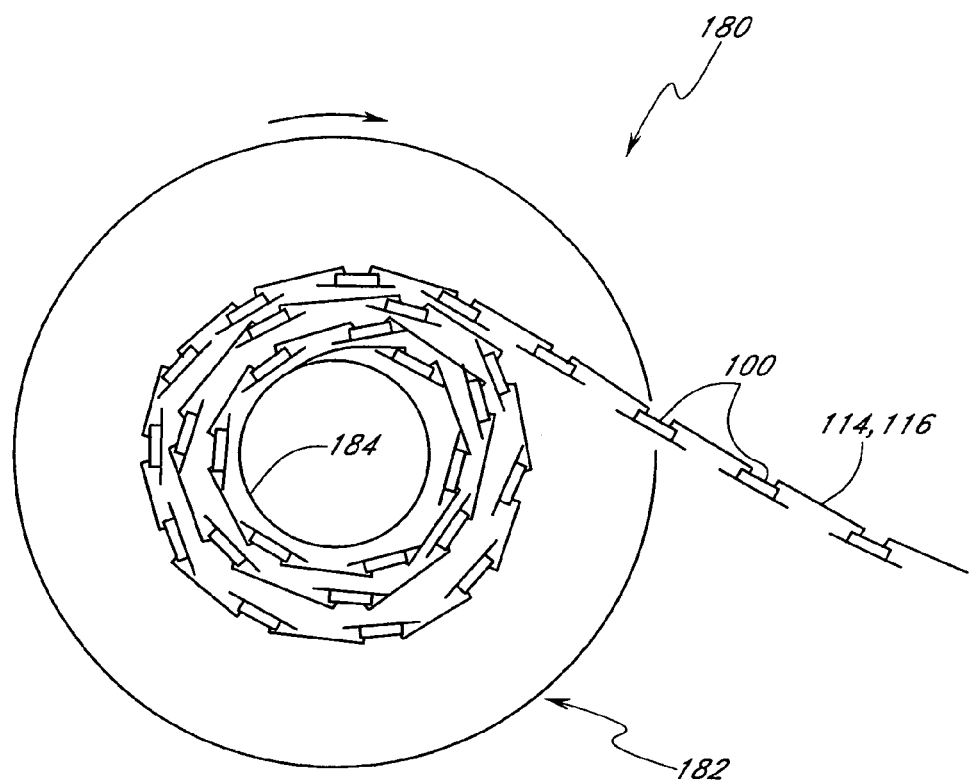
FIG. 21 is a side view of a plurality of wired-together LED modules such as the LED module of FIG. 9, arranged on a dispensing roll.
Figure 23:
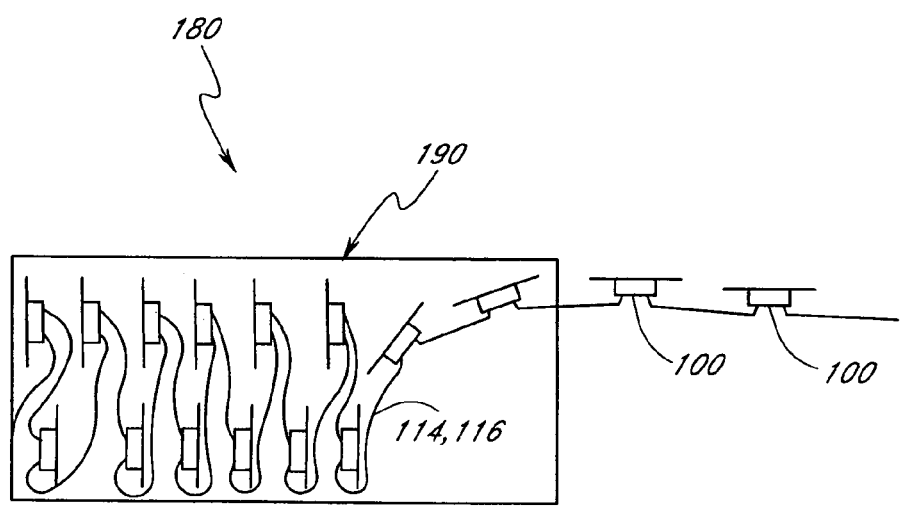
FIG. 23 is a plan view of a plurality of wired-together LED modules such as the LED module of FIG. 9, arranged within a box dispenser.
Figure 22:
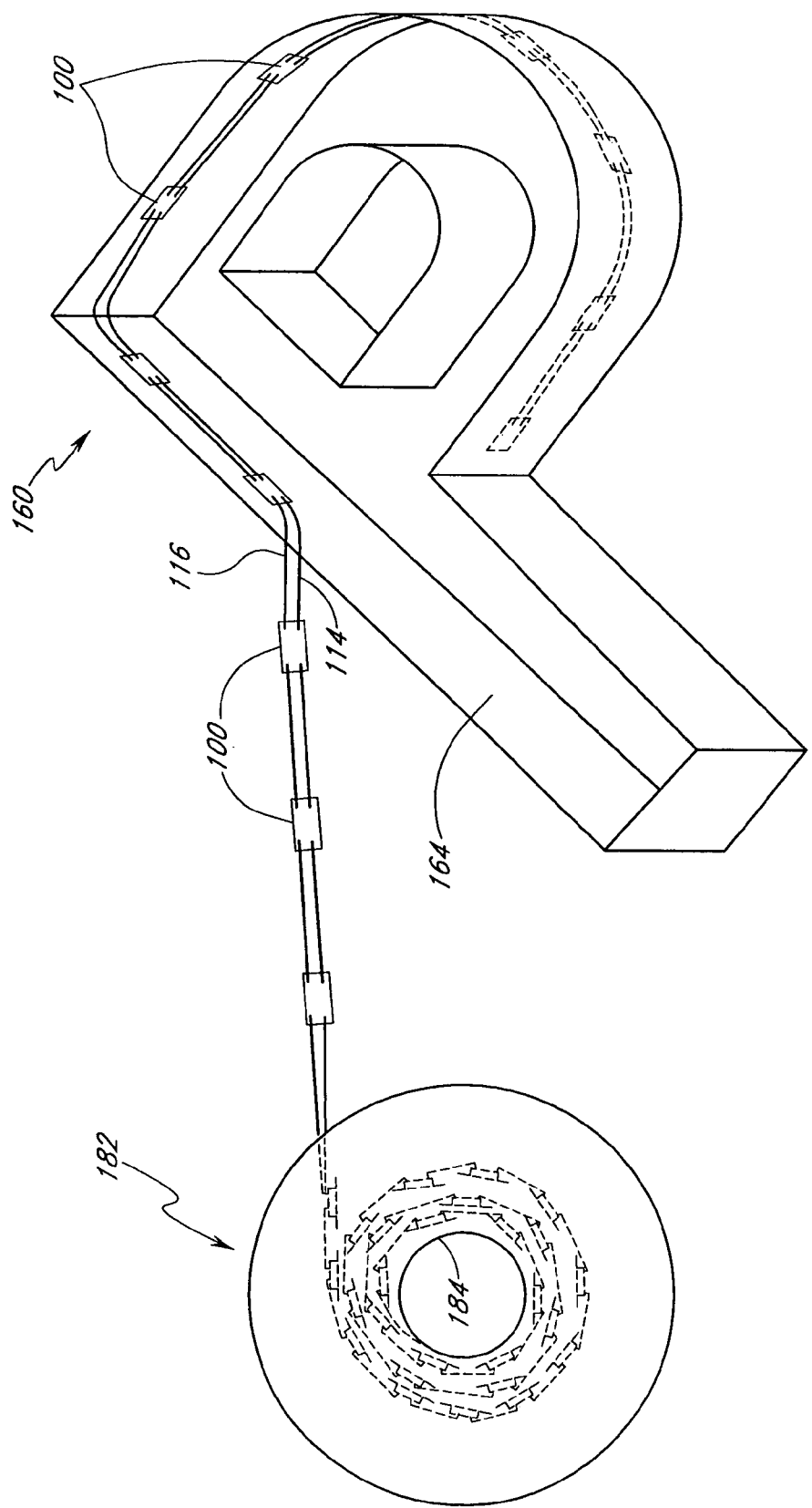
FIG. 22 shows wired-together modules from the dispensing roll of FIG. 21 being installed into a channel illumination apparatus.
Figure 24:
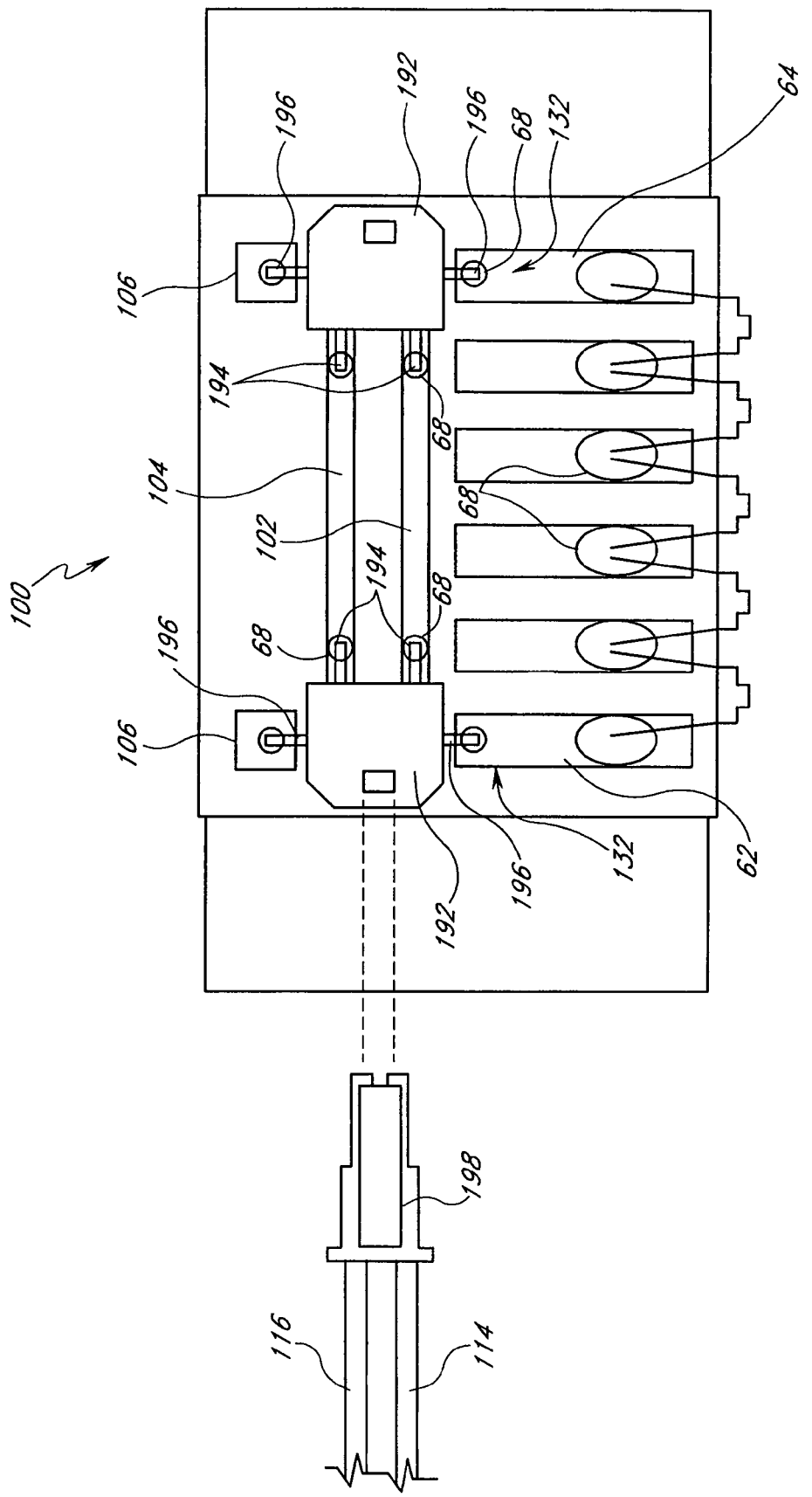
FIG. 24 is a plan view of an LED module having modular wire connectors.

With next reference to FIGS. 21-23, a plurality of modules 100, which have been wired together as shown in the embodiments of FIGS. 19 and 20, can be provided within a dispenser 180 to allow extremely easy and quick installation of the modules 100 into a light fixture such as a channel letter 160.

With reference specifically to FIGS. 21 and 22, a dispensing roll 182 can be provided having a multitude of such pre-wired LED modules 100 wound upon a roller 184. In order to install LED modules 100 within a channel letter 160 or other fixture, a worker will simply arrange the channel letter adjacent the roll 182 of LED modules, pull on the first available LED module 100 and secure the module, via its adhesive backing, in place on the wall 164 of the channel letter. As the module is pulled from the dispenser, adjacent connected modules are also drawn from the dispenser. Thus, once a module 100 is installed, another module 100, which is pre-wired together with the first module, is ready and waiting to be installed on the channel letter wall, as shown in FIG. 22. The worker thus progressively installs the pre-wired LED modules 100, and the dispensing roll 182 dispenses modules as required.

When the appropriate amount of LED modules 100 are installed, the worker simply snips the wires 114, 116, disconnecting the installed LED modules from the LED modules that are still on the dispensing roll 182. The wires 114, 116 of the installed modules are then connected to a power source 186 as depicted in FIG. 20. This method of installation is extremely fast. There is no need for the worker to perform soldering and there is very little wiring.

FIG. 23 shows another method and apparatus for dispensing a plurality of LED modules. In this embodiment, a box 190 or other type of dispenser is supplied in which a plurality of wired-together LED modules 100 are placed in an overlapping zigzag pattern. LED modules 100 are drawn from the dispenser as needed and unwind within the box dispenser 190 as they are drawn therefrom.

It is to be understood that, for both of the embodiments of FIGS. 21 and 23, a dispenser 180 can be provided that is sized to hold enough LED modules 100 to provide and satisfy the lighting needs of many channel letters 160 or other types of illumination devices so as to make manufacture of such devices efficient and easy. Such a dispenser could hold any desired number of modules. For example, a roller could be sized to hold 50, 100, 1000 or more modules in such a manner so that the interconnected modules do not become entangled.

Although the dispenser 180 is illustrated as a roller 182 or box 190, it is to be understood that any shape or form of dispenser can be used. In still another embodiment, the chain of wired-together modules can be coiled about itself rather than being wound about a roller.

While the preferred module 100 utilizes tape for securing the module to the surface, it will be understood that the above described dispensing arrangements may be used for modules that are not secured by tape, but by other means such as rivets, screws, glue, epoxy, etc.

Figure 18:
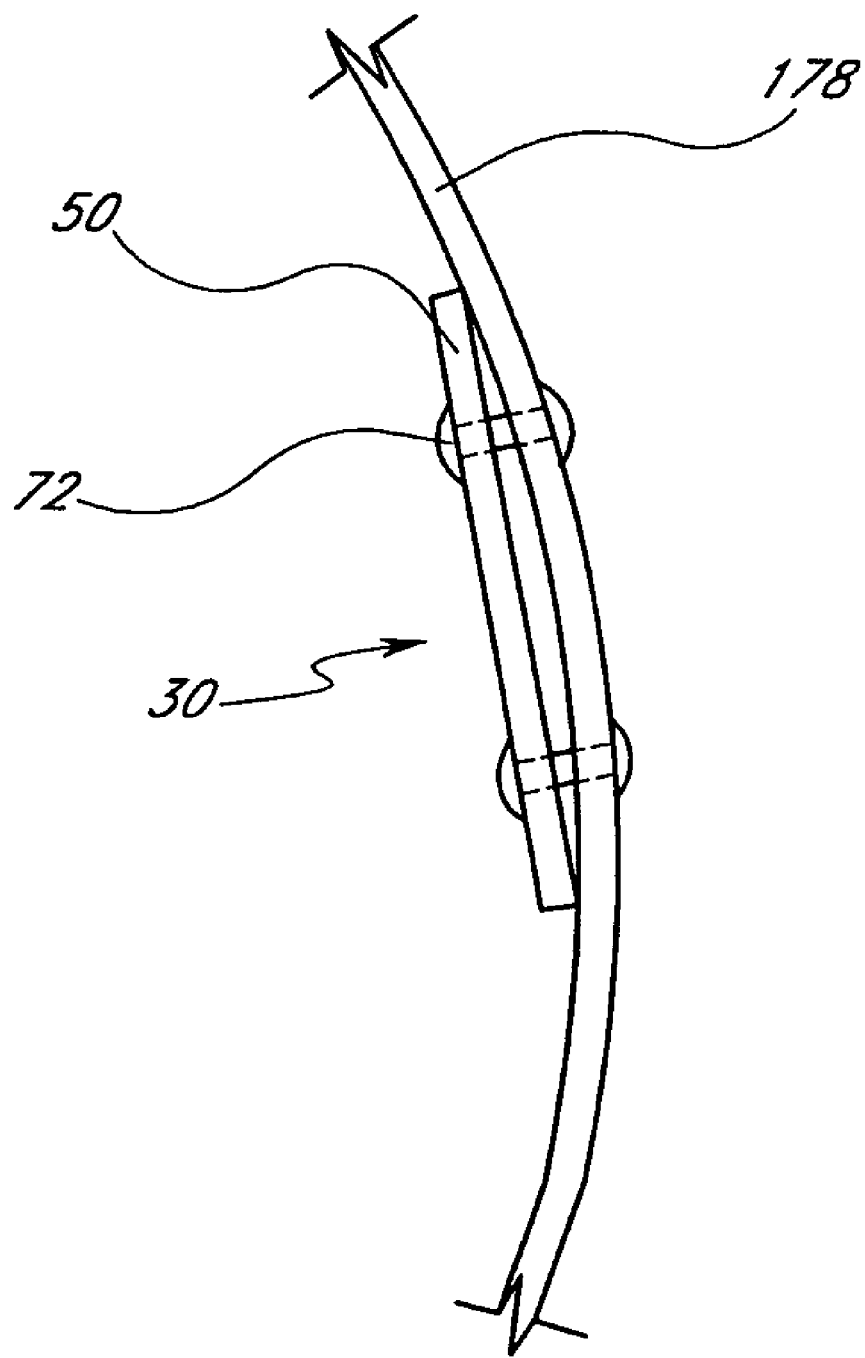
FIG. 18 is a top view of an LED module mounted to a wall of the apparatus of FIG. 15.

In the embodiment illustrated in FIG. 18, the electrical supply wires 114, 116 are soldered directly onto the power trace connecting portions 134, 136. It is to be understood that, in other embodiments, connectors can be provided on the traces, and the wires themselves may have connecting members to mate with the connectors that are provided on the LED module. For instance, FIG. 23 shows an LED module 100 having modular connectors 192 placed thereon. Leads 194 of the connectors 192 are connected to the first and second power traces 102, 104 using solder 68. The connectors 192 are thus electrically connected to the contacts 60. Mounting portions 196 of the connectors 192 engage and are soldered to the contact connecting portions 132 and the secondary connecting portions 106 in order to more securely hold the connector 192 onto the LED modules 100. The modular connectors 192 are adapted to engage mating wire connectors 198. The wire connectors 198 are attached to the electrical supply wires 114, 116. Thus, when the connectors 192, 198 are engaged, the desired electrically parallel arrangement is maintained. In embodiments employing connectors, a channel letter or other illumination apparatus can be assembled by assembling modules and wire components as needed, and simply connecting these components via the connectors.

Although this invention has been disclosed in the context of certain preferred embodiments and examples, it will be understood by those skilled in the art that the present invention extends beyond the specifically-disclosed embodiments to other alternative embodiments and/or uses of the invention and obvious modifications and equivalents thereof. In addition, while a number of variations have been shown and described in detail, other modifications, which are within the scope of this invention, will be readily apparent to those of skill in the art based upon this disclosure. It is also contemplated that various combinations or subcombinations of the specific features and aspects of the embodiments may be made and still fall within the scope of the invention. Accordingly, it should be understood that various features and aspects of the disclosed embodiments can be combined with or substituted for one another in order to form varying modes of the disclosed modular arrangement and method. Thus, it is intended that the scope of the present invention should not be limited by the particular disclosed embodiments described above, but should be determined only by a fair reading of the claims that follow.

What is claimed is:

1. A method of making an illuminated signage system, comprising:

providing a sign member configured according to a desired illumination shape and having a flat surface portion;

providing a plurality of light emitting diode (LED) modules that are electrically interconnected to each other in an electrically parallel arrangement, each of the LED modules comprising:

at least one LED;

a plurality of electrically conductive contacts, the at least one LED electrically communicating with at least one of the contacts;

a dielectric layer having a first side and a second side, the contacts being disposed on the first side; and a heat conductive body communicating with the second side of the dielectric layer, the heat conductive body configured to absorb heat generated by the at least one LED that flows through the dielectric layer, the heat conductive body comprising a generally flat portion disposed generally opposite the dielectric layer;

providing an adhesive member configured to connect the LED module to the flat surface portion of the sign member, at least part of the heat conductive body being disposed between the dielectric layer and the adhesive member; and adhering the adhesive member of each module to a surface of the sign member so that the generally flat portion of the heat conductive body is arranged generally complementary to the flat surface portion of the sign member.

2. The method of claim 1, wherein the signage system comprises a channel illumination apparatus, and the sign member comprises a casing having a plurality of side walls and a back wall that cooperate to define a channel, and wherein each module is disposed within the channel.

3. The method of claim 2, wherein at least one LED module is adhered to one of the side walls.

4. The method of claim 2, wherein a plurality of LED modules are arranged spaced apart from one another within the channel, and additionally comprising providing a translucent light diffuser and affixing the light diffuser to the casing so as to enclose the channel.

5. The method of claim 1, wherein the sign member comprises a plurality of flat surfaces and at least one curved surface.

6. The method of claim 5, wherein the sign member comprises a metal portion, and comprising adhering the LED modules onto the metal portion of the sign member.

7. The method of claim 1, wherein the adhesive member is attached directly to the heat conductive body.

8. The method of claim 7, wherein the adhesive on the body is adhered directly to a surface of the sign member.

9. The method of claim 1, wherein the LED modules are arranged in a dispenser, and additionally comprising drawing successive modules from the dispenser and adhering them into place on the sign member.

10. The method of claim 9, wherein the adhesive portion comprises a tape having a backing, and adhering the adhesive portion to a surface comprises removing the backing and placing the module on the surface.

11. The method of claim 1, wherein contacts are arranged only on the first side of the dielectric layer.

12. The method of claim 11, wherein the heat conductive body comprises a metal.

13. The method of claim 12, wherein the heat conductive body has a unitary structure.

14. The method of claim 12, wherein the heat conductive body comprises a circuit board.

15. The method of claim 1, wherein at least two of the plurality of electrically conductive contacts of the LED modules extend longitudinally and generally parallel along a length of the LED module.

16. The method of claim 15 additionally comprising providing first and second electrical connectors communicating with opposing ends of the at least two longitudinally extending contacts on a plurality of the LED modules.

17. The method of claim 16 additionally comprising electrically attaching connectors of adjacent LED modules together to form a chain of LED modules.

18. The method of claim 17, wherein the at least one LED of each LED module is arranged electrically in parallel with the at least one LED of each other LED module that is part of the chain of LED modules.

* * * * *